US012610644B2

(12) United States Patent
Komuro et al.

(10) Patent No.: US 12,610,644 B2
(45) Date of Patent: Apr. 21, 2026

(54) LIGHT RECEIVING ELEMENT, DISTANCE MEASUREMENT MODULE, AND ELECTRONIC EQUIPMENT INCLUDING A REFLECTION FILM

(71) Applicant: SONY SEMICONDUCTOR SOLUTIONS CORPORATION, Kanagawa (JP)

(72) Inventors: Yutaro Komuro, Nagasaki (JP); Yoshiki Ebiko, Kanagawa (JP); Tomoharu Ogita, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 578 days.

(21) Appl. No.: 17/770,257

(22) PCT Filed: Oct. 16, 2020

(86) PCT No.: PCT/JP2020/039052
§ 371 (c)(1),
(2) Date: Apr. 19, 2022

(87) PCT Pub. No.: WO2021/085172
PCT Pub. Date: May 6, 2021

(65) Prior Publication Data
US 2022/0293658 A1 Sep. 15, 2022

(30) Foreign Application Priority Data

Oct. 30, 2019 (JP) ................................. 2019-197020

(51) Int. Cl.
H10F 39/00 (2025.01)
G01S 7/481 (2006.01)
(Continued)

(52) U.S. Cl.
CPC ........ H10F 39/8067 (2025.01); G01S 7/4816 (2013.01); G01S 7/4863 (2013.01);
(Continued)

(58) Field of Classification Search
CPC ........... H01L 27/14623; H01L 27/1463; H01L 27/14629; H01L 27/1464; H01L 27/14649;
(Continued)

(56) References Cited

U.S. PATENT DOCUMENTS

2008/0135963 A1 6/2008 Akiyama
2008/0290441 A1* 11/2008 Hsu ..................... H01L 27/1464
257/460
(Continued)

FOREIGN PATENT DOCUMENTS

CN 105428379 A 3/2016
CN 109155323 A 1/2019
(Continued)

OTHER PUBLICATIONS

International Search Report prepared by the Japan Patent Office on Dec. 3, 2020, for International Application No. PCT/JP2020/ 039052, 3 pgs.

*Primary Examiner* — Jennifer D Bennett
(74) *Attorney, Agent, or Firm* — SHERIDAN ROSS P.C.

(57) ABSTRACT

The present technology relates to a light receiving element, a distance measurement module, and electronic equipment which are capable of reducing leakage of incident light to adjacent pixels. The light receiving element includes an on-chip lens, a wiring layer, and a semiconductor layer which is disposed between the on-chip lens and the wiring layer and includes a photodiode. The wiring layer includes a reflection film which is disposed such that at least a portion thereof overlaps the photodiode when seen in a plan view, (Continued)

and a transfer transistor which reads charge generated by the photodiode, and the reflection film is formed of a material different from that of a metal wiring electrically connected to a gate of the transfer transistor. The present technology can be applied to, for example, a distance measurement module that measures a distance to a subject, and the like.

19 Claims, 32 Drawing Sheets

(51) Int. Cl.

| | | |
|---|---|---|
| *G01S 7/4863* | (2020.01) | |
| *G01S 17/894* | (2020.01) | |
| *G02B 1/118* | (2015.01) | |
| *H10F 39/12* | (2025.01) | |
| *H10F 39/18* | (2025.01) | |
| *H10F 77/30* | (2025.01) | |
| *H10F 77/40* | (2025.01) | |

(52) U.S. Cl.

CPC ........ *G01S 17/894* (2020.01); *H10F 39/8057* (2025.01); *H10F 39/807* (2025.01); *H10F 77/331* (2025.01); *H10F 77/334* (2025.01); *H10F 77/413* (2025.01); *G02B 1/118* (2013.01); *H10F 39/184* (2025.01); *H10F 39/199* (2025.01); *H10F 39/8037* (2025.01)

(58) Field of Classification Search

CPC ...... G01S 7/4816; G01S 7/4863; G01S 17/10; H10F 39/8067; H10F 39/8057; H10F 39/807; H10F 77/331; H10F 77/334; H10F 77/413; H10F 39/184; H10F 39/199; H10F 39/8037; G02B 1/118

See application file for complete search history.

(56) References Cited

U.S. PATENT DOCUMENTS

| | | | | |
|---|---|---|---|---|
| 2011/0234830 A1* | 9/2011 | Kiyota | .................. | H10F 39/014 |
| | | | | 348/222.1 |
| 2014/0111664 A1 | 4/2014 | Kumano | | |
| 2014/0132812 A1* | 5/2014 | Soda | ................... | H01L 27/1464 |
| | | | | 257/432 |
| 2014/0151753 A1 | 6/2014 | Konishi | | |
| 2016/0111457 A1 | 4/2016 | Sekine | | |
| 2017/0110493 A1 | 4/2017 | Yokogawa | | |
| 2017/0229503 A1 | 8/2017 | Suzuki et al. | | |
| 2019/0157323 A1 | 5/2019 | Ogi et al. | | |
| 2019/0244992 A1 | 8/2019 | Yokogawa et al. | | |
| 2020/0194474 A1* | 6/2020 | Meynants | .......... | H01L 27/1462 |

FOREIGN PATENT DOCUMENTS

| | | | |
|---|---|---|---|
| CN | 109906512 A | | 6/2019 |
| DE | 102018108794 B3 | * | 5/2019 |
| JP | H07-288335 | | 10/1995 |
| JP | 2006-261372 | | 9/2006 |
| JP | 2008035395 A | | 2/2008 |
| JP | 2008-147333 | | 6/2008 |
| JP | 2009-047658 | | 3/2009 |
| JP | 2009-047661 | | 3/2009 |
| JP | 2010186818 A | | 8/2010 |
| JP | 2011-086904 | | 4/2011 |
| JP | 2013-030510 | | 2/2013 |
| JP | 2014-086514 | | 5/2014 |
| JP | 2015-056408 | | 3/2015 |
| JP | 2016-001633 | | 1/2016 |
| JP | 2016-082133 | | 5/2016 |
| JP | WO2018034092 A1 | | 6/2019 |
| KR | 20190067179 A | | 6/2019 |
| WO | WO 2018/079296 | | 5/2018 |
| WO | WO 2018/174090 | | 9/2018 |
| WO | WO-2018219786 A1 | | 12/2018 |

* cited by examiner

LIGHT RECEIVING ELEMENT, DISTANCE MEASUREMENT MODULE, AND ELECTRONIC EQUIPMENT INCLUDING A REFLECTION FILM

CROSS REFERENCE TO RELATED APPLICATIONS

This application is a national stage application under 35 U.S.C. 371 and claims the benefit of PCT Application No. PCT/JP2020/039052, having an international filing date of 16 Oct. 2020, which designated the United States, which PCT application claimed the benefit of Japanese Patent Application No. 2019-197020, filed 30 Oct. 2019, the entire disclosures of each of which are incorporated herein by reference.

TECHNICAL FIELD

The present technology relates to a light receiving element, a distance measurement module, and electronic equipment, and more particularly, to a light receiving element, a distance measurement module, and electronic equipment which are capable of reducing leakage of incident light to adjacent pixels.

BACKGROUND ART

In the related art, distance measurement systems using an indirect time of flight (ToF) scheme are known. In such a distance measurement system, it is indispensable to include a sensor that can rapidly distribute signal charge, which is obtained by receiving reflected light of active light hit by an object, to different regions, the active light being emitted using a light emitting diode (LED) or a laser at a certain phase.

Consequently, for example, a technique capable of rapidly modulating a region in a wide range in a substrate of a sensor by directly applying a voltage to the substrate to generate current in the substrate has been proposed (see, for example, PTL 1).

CITATION LIST

Patent Literature

[PTL 1]
JP 2011-86904A

SUMMARY

Technical Problem

In many cases, near infrared rays with a wavelength of approximately 940 nm are used as a light source of a light receiving element used in an indirect ToF scheme. Since silicon of a semiconductor layer has a low absorption coefficient for near infrared rays, and has low quantum efficiency, a structure that increases quantum efficiency by extending an optical path length is conceivable, but there is concern about leakage of incident light to adjacent pixels.

The present technology is contrived in view of such circumstances and can make it possible to reduce leakage of incident light to adjacent pixels.

Solution to Problem

A light receiving element according to a first aspect of the present technology includes an on-chip lens, a wiring layer, and a semiconductor layer which is disposed between the on-chip lens and the wiring layer and includes a photodiode, in which the wiring layer includes a reflection film which is disposed such that at least a portion thereof overlaps the photodiode when seen in a plan view, and a transfer transistor which reads charge generated by the photodiode, and the reflection film is formed of a material different from that of a metal wiring electrically connected to a gate of the transfer transistor.

A distance measurement module according to a second aspect of the present technology includes a predetermined light emitting source, and a light receiving element, in which the light receiving element includes an on-chip lens, a wiring layer, and a semiconductor layer which is disposed between the on-chip lens and the wiring layer and includes a photodiode, the wiring layer includes a reflection film which is disposed such that at least a portion thereof overlaps the photodiode when seen in a plan view, and a transfer transistor which reads charge generated by the photodiode, and the reflection film is formed of a material different from that of a metal wiring electrically connected to a gate of the transfer transistor.

Electronic equipment according to a third aspect of the present technology includes a distance measurement module including a predetermined light emitting source, and a light receiving element, in which the light receiving element includes an on-chip lens, a wiring layer, and a semiconductor layer which is disposed between the on-chip lens and the wiring layer and includes a photodiode, the wiring layer includes a reflection film which is disposed such that at least a portion thereof overlaps the photodiode when seen in a plan view, and a transfer transistor which reads charge generated by the photodiode, and the reflection film is formed of a material different from that of a metal wiring electrically connected to a gate of the transfer transistor.

In the first to third aspects of the present technology, a light receiving element is provided with an on-chip lens, a wiring layer, and a semiconductor layer which is disposed between the on-chip lens and the wiring layer and includes a photodiode, the wiring layer is provided with a reflection film which is disposed such that at least a portion thereof overlaps the photodiode when seen in a plan view, and a transfer transistor which reads charge generated by the photodiode, and the reflection film is formed of a material different from that of a metal wiring electrically connected to a gate of the transfer transistor.

The light receiving element, the distance measurement module, and the electronic equipment may be independent devices, or may be modules incorporated into other devices.

DESCRIPTION OF EMBODIMENTS

Figure 1:
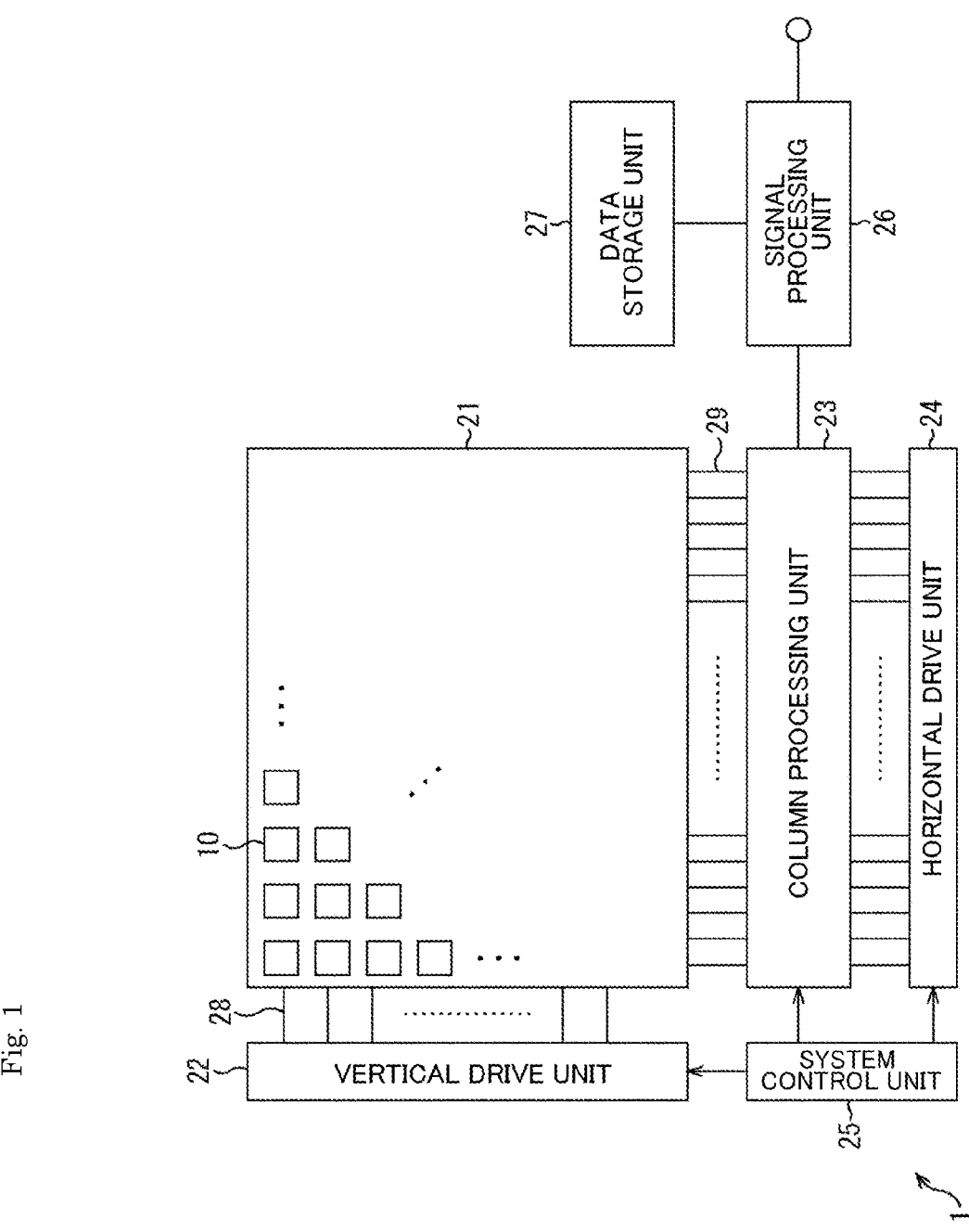
FIG. 1 is a block diagram illustrating a schematic configuration example of a light receiving element to which the present technology is applied.

Modes for embodying the present technology (hereinafter referred to as embodiments) will be described below. Note that the description will be made in the following order.
1. Configuration example of light receiving element
2. Cross-sectional view according to first configuration example of pixel 3. Modification example of first configuration example
4. Circuit configuration example of pixel
5. Plan view of pixel
6. Other circuit configuration example of pixel
7. Plan view of pixel
8. Cross-sectional view according to second configuration example of pixel
9. Cross-sectional view according to third configuration example of pixel
10. Modification example of third configuration example
11. Cross-sectional view according to fourth configuration example of pixel
12. Cross-sectional view according to fifth configuration example of pixel
13. Cross-sectional view according to sixth configuration example of pixel
14. Cross-sectional view according to seventh configuration example of pixel
15. Cross-sectional view according to eighth configuration example of pixel
16. Cross-sectional view according to ninth configuration example of pixel
17. Configuration example of IR imaging sensor
18. Configuration example of RGBIR imaging sensor
19. Configuration example of distance measurement module
20. Configuration example of electronic equipment
21. Example of application to moving body Note that, in drawings to be referred to hereinafter, same or similar portions are denoted by same or similar reference signs. However, the drawings are schematic and relationships between thicknesses and plan view dimensions, ratios of thicknesses of respective layers, and the like differ from those in real. In addition, drawings include portions where dimensional relationships and ratios differ between the drawings in some cases.

In addition, definitions of directions such as up-down in the following descriptions are merely definitions provided for the sake of brevity and are not intended to limit the technical ideas of the present disclosure. For example, when an object is observed after being rotated by 90 degrees, up-down is converted into and interpreted as left-right, and when an object is observed after being rotated by 180 degrees, up-down is interpreted as being inverted.

1. CONFIGURATION EXAMPLE OF LIGHT RECEIVING ELEMENT

FIG. 1 is a block diagram illustrating a schematic configuration example of a light receiving element to which the present technology is applied.

A light receiving element 1 illustrated in FIG. 1 is a ToF sensor that outputs distance measurement information by an indirect ToF scheme.

The light receiving element 1 receives light (reflected light) obtained by reflection of light emitted from a predetermined light source (irradiation light) and hitting against an object, and outputs a depth image in which information on a distance to the object is stored as depth values. Note that irradiation light emitted from a light source is, for example, infrared rays with a wavelength in a range from 780 nm to 1000 nm, and is pulse light of which turn-on and turn-off are repeated in a predetermined cycle.

The light receiving element 1 includes a pixel array portion 21 formed on a semiconductor substrate not illustrated in the drawing, and a peripheral circuit portion integrated on the same semiconductor substrate as that of the pixel array portion 21. The peripheral circuit portion includes, for example, a vertical drive unit 22, a column processing unit 23, a horizontal drive unit 24, a system control unit 25, and the like.

The light receiving element 1 is further provided with a signal processing unit 26 and a data storage unit 27. Note that the signal processing unit 26 and the data storage unit 27 may be mounted on the same substrate as that of the light receiving element 1, and may be disposed on a substrate in a module different from that the light receiving element 1.

The pixel array portion 21 generates charge corresponding to the amount of received light, and is configured such that pixels 10 outputting signals corresponding to the charge are disposed in a two-dimensional matrix in a row direction and a column direction. That is, the pixel array portion 21 performs photoelectric conversion of incident light and includes a plurality of pixels 10 that output signals corresponding to charge obtained as a result of the photoelectric conversion. Here, the row direction is a direction in which the pixels 10 are arranged in the horizontal direction, and the column direction is a direction in which the pixels 10 are arranged in the vertical direction. The row direction is a transverse direction in the drawing, and the column direction is a longitudinal direction in the drawing. Details of the pixel 10 will be described later in FIG. 2 and the subsequent drawings.

In the pixel array portion 21, a pixel drive line 28 is wired in the row direction for each pixel row and two vertical signal lines 29 are wired in the column direction for each pixel column in a pixel array having a matrix form. The pixel drive line 28 transmits a drive signal for performing driving at the time of reading out a signal from the pixel 10. Note that, in FIG. 1, one wiring is illustrated for the pixel drive line 28, but the number of wirings is not limited to one. One end of the pixel drive line 28 is connected to an output end corresponding to each row of the vertical drive unit 22.

The vertical drive unit 22, which is constituted by a shift register, an address decoder, or the like, drives all of the pixels 10 of the pixel array portion 21 at the same time, in units of rows, or the like. That is, the vertical drive unit 22 constitutes a drive unit that controls an operation of each pixel 10 of the pixel array portion 21 along with the system control unit 25 controlling the vertical drive unit 22.

A detection signal which is output from each pixel 10 of a pixel row in accordance with driving control of the vertical drive unit 22 is input to the column processing unit 23 through the vertical signal line 29. The column processing unit 23 performs predetermined signal processing on a detection signal which is output from each pixel 10 through the vertical signal line 29, and temporarily holds the detection signal having been subjected to the signal processing. The column processing unit 23 specifically performs noise removal processing, analog to digital (AD) conversion processing, or the like as signal processing.

The horizontal drive unit 24 is constituted by a shift register, an address decoder, or the like and sequentially selects unit circuits corresponding to the pixel columns of the column processing unit 23. Through selective scanning of the horizontal drive unit 24, detection signals subjected to the signal processing for each unit circuit in the column processing unit 23 are sequentially output to the signal processing unit 26.

The system control unit 25, which is constituted by a timing generator for generating various timing signals, or the like, performs driving control of the vertical drive unit 22, the column processing unit 23, the horizontal drive unit 24, and the like on the basis of the various timing signals generated by the timing generator.

The signal processing unit 26 has at least a calculation processing function and performs various signal processing such as calculation processing on the basis of a detection signal which is output from the column processing unit 23. The data storage unit 27 temporarily stores data required for signal processing performed by the signal processing unit 26 when performing the signal processing.

The light receiving element 1 configured as described above outputs a depth image in which information on a distance to an object is stored in pixel values as a depth value.

2. CROSS-SECTIONAL VIEW ACCORDING TO FIRST CONFIGURATION EXAMPLE OF PIXEL

Figure 2:
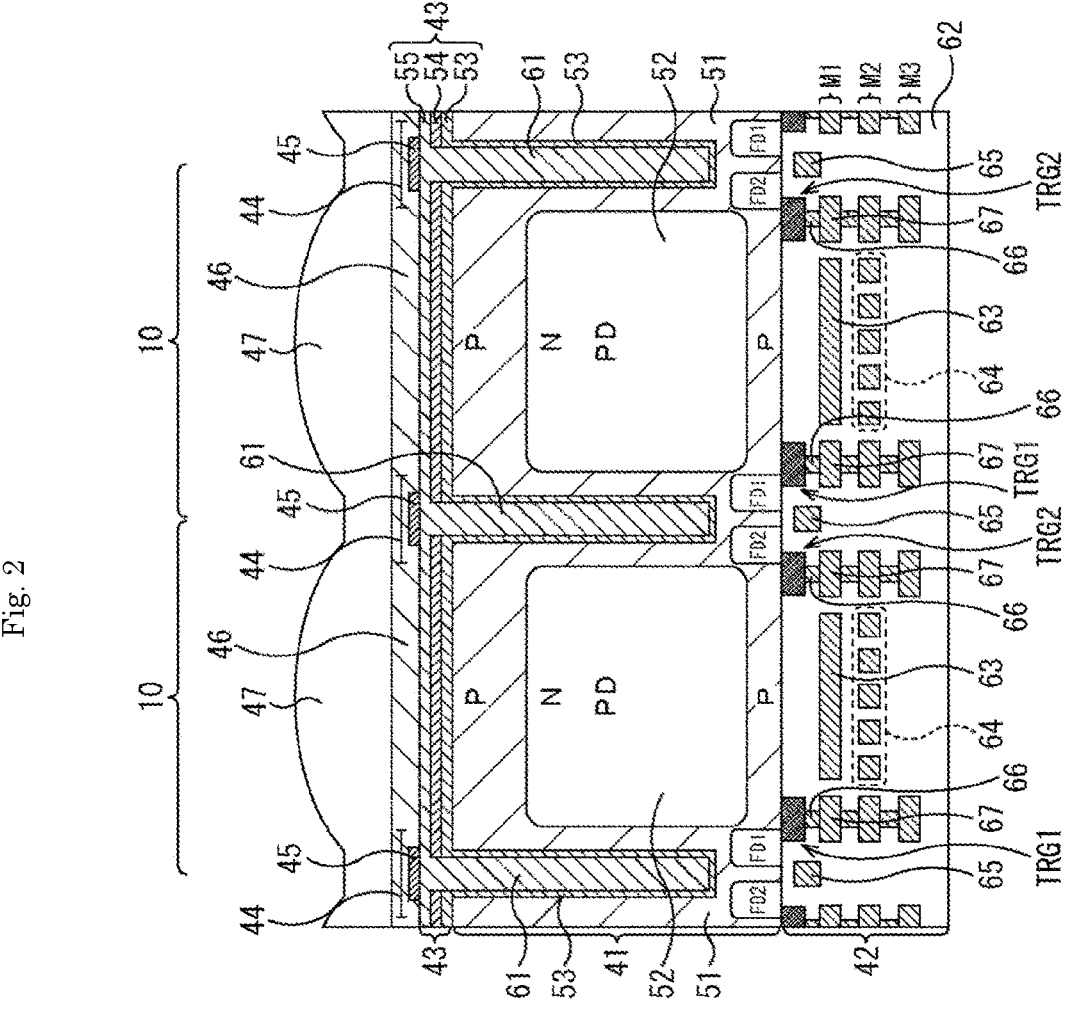
FIG. 2 is a cross-sectional view illustrating a first configuration example of pixels.

FIG. 2 is a cross-sectional view illustrating a first configuration example of the pixels 10 disposed in the pixel array portion 21.

The light receiving element 1 includes a semiconductor substrate 41 and a multi-layered wiring layer 42 formed on the surface side (the lower side in the drawing) of the semiconductor substrate.

The semiconductor substrate 41 is formed of, for example, silicon (Si) and is formed to have a thickness of, for example, approximately several μm. In the semiconductor substrate 41, for example, N-type (second conductive type) semiconductor regions 52 are formed in units of pixels in a P-type (first conductive type) semiconductor region 51, and thus photodiodes PD are formed in units of pixels. The P-type semiconductor region 51 provided on both the surface and the rear surface of the semiconductor substrate 41 also serves as a hole charge storage region for suppressing a dark current.

The upper surface of the semiconductor substrate 41 which is on the upper side in FIG. 2 is the rear surface of the semiconductor substrate 41 and is a light incident surface on which light is incident. An antireflection film 43 is formed on the upper surface of the semiconductor substrate 41 on the rear surface side.

The antireflection film 43 has a laminated structure in which, for example, a fixed charge film and an oxide film are laminated, and for example, an insulated thin film having a high dielectric constant (High-k) according to an atomic layer deposition (ALD) method may be used. Specifically, hafnium oxide ($HfO_2$), aluminum oxide ($Al_2O_3$), titanium oxide ($TiO_2$), strontium titan oxide (STO), and the like can be used. In the example of FIG. 2, the antireflection film 43 is configured such that a hafnium oxide film 53, an aluminum oxide film 54, and a silicon oxide film 55 are laminated.

An inter-pixel light shielding film 45 that prevents incident light from being incident on adjacent pixels is formed on the upper surface of the antireflection film 43 and at a boundary portion 44 of the pixel 10 adjacent to the semiconductor substrate 41 (hereinafter also referred to as a pixel boundary portion 44). A material of the inter-pixel light shielding film 45 only needs to be a material that shields light, and examples of the material include metal materials such as tungsten (W), aluminum (Al), and copper (Cu).

A flattening film 46 is constituted by an insulating film of such as silicon oxide ($SiO_2$), silicon nitride (SiN), silicon oxynitride (SiON), or an organic material such as a resin on the upper surface of the antireflection film 43 and the upper surface of the inter-pixel light shielding film 45.

Then, an on-chip lens 47 is formed on the upper surface of the flattening film 46 in units of pixels. The on-chip lens 47 is formed of a resin material such as a styrene-based resin, an acrylic-based resin, a styrene-acrylic copolymer resin, or a siloxane-based resin. Light collected by the on-chip lens 47 is efficiently incident on a photodiode PD.

In addition, an inter-pixel separation portion 61 that separates adjacent pixels is formed from the rear surface side (on-chip lens 47 side) of the semiconductor substrate 41 to a predetermined depth in a substrate depth direction at the pixel boundary portion 44 on the rear surface side of the semiconductor substrate 41. An outer circumference portion including a bottom surface and a side wall of the inter-pixel separation portion 61 is covered with the hafnium oxide film 53 which is a portion of the antireflection film 43. The inter-pixel separation portion 61 prevents incident light from penetrating the next pixel 10 to confine the incident light in its own pixel, and prevents leakage of incident light from the adjacent pixel 10.

In the example of FIG. 2, the silicon oxide film 55 and the inter-pixel separation portion 61 are formed at the same time by embedding the silicon oxide film 55, which is a material of an uppermost layer of the antireflection film 43, in a trench (groove) dug from the rear surface side, and thus the silicon oxide film 55 which is a portion of the laminated film as the antireflection film 43 and the inter-pixel separation portion 61 are formed of the same material but their materials do not necessarily need to be the same. The material embedded in the trench (groove) dug from the rear surface side as the inter-pixel separation portion 61 may be a metal material such as tungsten (W), aluminum (Al), titanium (Ti), or titanium nitride (TiN).

On the other hand, two transfer transistors TRG1 and TRG2 are formed for one photodiode PD formed in each pixel 10 on the surface side of the semiconductor substrate 41 on which the multi-layered wiring layer 42 is formed. In addition, floating diffusion regions FD1 and FD2 as charge accumulation portions for temporarily holding charge transferred from the photodiode PD are constituted by a high-concentration N-type semiconductor region (N-type diffusion region) on the surface side of the semiconductor substrate 41.

The multi-layered wiring layer 42 is constituted by a plurality of metal films M and an insulating interlayer film 62 therebetween. In FIG. 2, an example in which the multi-layered wiring layer 42 is constituted by three layers of a first metal film M1 to a third metal film M3 is illustrated.

A reflection film (reflection member) 63 is formed in a region which is positioned below a region where the photodiode PD is formed in the first metal film M1 closest to the semiconductor substrate 41, among the plurality of metal films M of the multi-layered wiring layer 42, that is, in a region of which at least a portion overlaps the region where the photodiode PD is formed when seen in a plan view. The reflection film 63 is formed of the same material as that of the other metal wirings 67 of the first metal film M1, for example, a metal film such as copper (Cu), aluminum (Al), tungsten (W), titanium (Ti), or titanium nitride (TiN).

The reflection film 63 has a function of making infrared rays, incident into the semiconductor substrate 41 from a light incident surface through the on-chip lens 47 and having passed through the semiconductor substrate 41 without being subjected to photoelectric conversion in the semiconductor substrate 41, be reflected at the reflection film 63 and incident into the semiconductor substrate 41 again. By such a reflection function, it is possible to increase the amount of infrared rays subjected to photoelectric conversion in the semiconductor substrate 41 and improve quantum efficiency (QE), that is, the sensitivity of the pixel 10 for infrared rays.

In addition, the reflection film 63 shields infrared rays, incident into the semiconductor substrate 41 from a light incident surface through the on-chip lens 47 and having passed through the semiconductor substrate 41 without being subjected to photoelectric conversion in the semiconductor substrate 41, by the first metal film M1 closest to the semiconductor substrate 41 and prevents the infrared rays from passing through a second metal film M2 and a third metal film M3 positioned below the first metal film M1. Thus, the reflection film 63 can also be referred to as a light shielding film. By such a light shielding function, it is possible to prevent infrared rays, having passed through the semiconductor substrate 41 without being subjected to photoelectric conversion in the semiconductor substrate 41, from being dispersed by the metal film M below the first metal film M1 and being incident on surrounding pixels. Thereby, it is possible to prevent light from being detected erroneously in the surrounding pixels.

In addition, an inter-pixel light shielding unit 65 that prevents incident light, which is reflected by the reflection film 63, from being incident on the photodiode PD of the next pixel 10 is formed at the pixel boundary portion 44 of the multi-layered wiring layer 42. As the material of the inter-pixel light shielding unit 65, for example, the same material as that of the metal wiring 67 of the first metal film M1 including the reflection film 63 may be used. In addition, for example, when the metal wiring 67 is copper, a material different from that of the metal wiring 67 of the first metal film M1 may be used as the material of the inter-pixel light shielding unit 65 by using tungsten as the material or constituting the inter-pixel light shielding unit 65 by an infrared absorption film using an organic material, or the like.

The position of the inter-pixel light shielding unit 65 in a substrate depth direction is above (semiconductor substrate 41 side) the reflection film 63 of the first metal film M1 in order to accomplish the purpose of the inter-pixel light shielding unit 65. For example, the inter-pixel light shielding unit 65 is formed at the same position (position in a depth direction) as a layer of a gate contact 66 that connects a gate of the transfer transistor TRG1 or TRG2 formed of poly-silicon or the like and the metal wiring 67 of the first metal film M1, or is formed on a side closer to the semiconductor substrate 41. In a case where the inter-pixel light shielding unit 65 is formed at the same position as the layer of the gate contact 66, the inter-pixel light shielding unit 65 and the gate contact 66 can be formed at the same time, and thus it is possible to share operations and reduce the number of steps.

Note that a metal wiring which is electrically connected to the gate of the transfer transistor TRG1 or TRG2 through the gate contact 66 among the metal wirings 67 of the first metal film M1 is referred to as a contact wiring 67.

A wiring capacitance 64 is formed in, for example, the second metal film M2, which is a predetermined metal film M among the plurality of metal films M of the multi-layered wiring layer 42, by forming a pattern, for example, in a comb tooth shape. The reflection film 63 and the wiring capacitance 64 may be formed in the same layer (metal film M), but in a case where they are formed in different layers, the wiring capacitance 64 is formed in a layer farther from the semiconductor substrate 41 than the reflection film 63. In other words, the reflection film 63 is formed to be closer to the semiconductor substrate 41 than the wiring capacitance 64 is.

As described above, the light receiving element 1 has a rear surface irradiation type structure in which the semiconductor substrate 41 which is a semiconductor layer is disposed between the on-chip lens 47 and the multi-layered wiring layer 42, and incident light is incident on the photodiode PD from the rear surface side where the on-chip lens 47 is formed.

In addition, the pixel 10 includes two transfer transistors TRG1 and TRG2 for the photodiode PD provided in each pixel, and is configured to be able to distribute charge (electrons) generated by being subjected to photoelectric conversion in the photodiode PD to the floating diffusion region FD1 or FD2.

Reflected light received by the light receiving element 1, which is infrared rays having a wavelength of approximately 780 nm to 1000 nm, is less absorbed by silicon of the semiconductor substrate 41 and has low quantum efficiency. For this reason, in the pixel 10 according to the first configuration example, the inter-pixel separation portion 61 is formed in the pixel boundary portion 44 to prevent incident light from penetrating the next pixel 10 to confine the incident light in its own pixel, and prevent leakage of incident light from the adjacent pixel 10. In addition, by providing the reflection film 63 in a metal film M below the region where the photodiode PD is formed, infrared rays which have passed through the semiconductor substrate 41 without being subjected to photoelectric conversion in the semiconductor substrate 41 are reflected by the reflection film 63, and the infrared rays are made to be incident into the semiconductor substrate 41 again.

Figure 3:
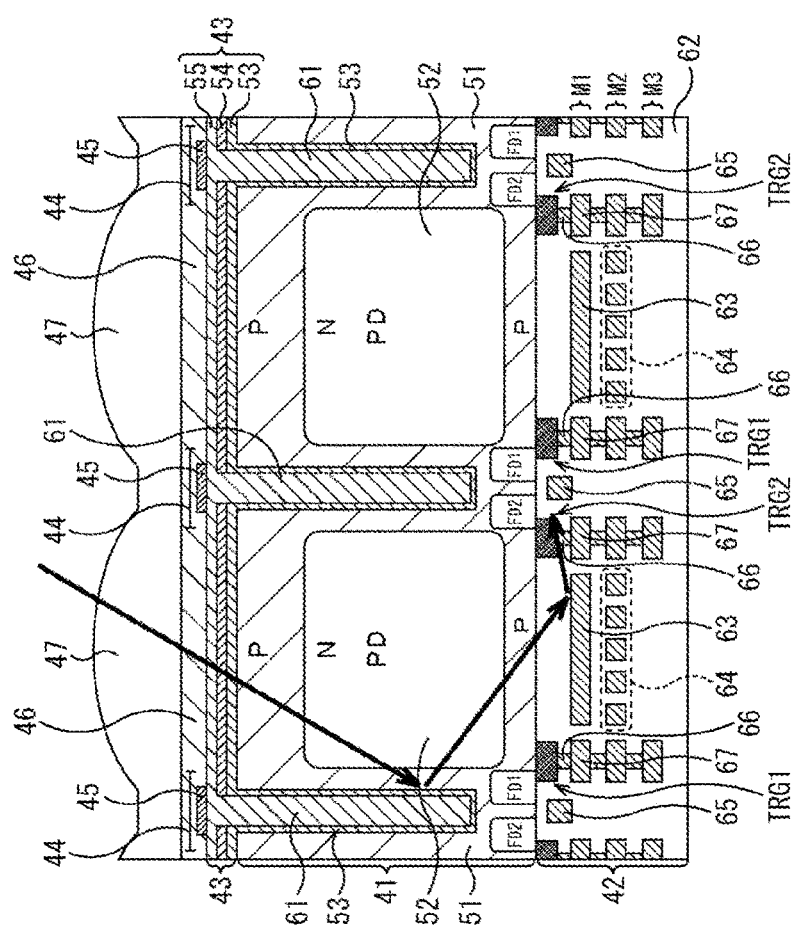
FIG. 3 is a diagram illustrating effects of an inter-pixel light shielding unit.

On the other hand, the reflection film 63 is provided in the first metal film M1 below the region where the photodiode PD is formed, and thus there is a concern that incident light reflected by the reflection film 63 may penetrate an adjacent pixel, for example, as indicated by an arrow in FIG. 3. Consequently, the inter-pixel light shielding unit 65 is formed in the pixel boundary portion 44 of the multi-layered wiring layer 42 to prevent leakage of incident light to an adjacent pixel due to wraparound from the multi-layered wiring layer 42.

With the above-described configuration, it is possible to increase the amount of infrared rays subjected to photoelectric conversion in the semiconductor substrate 41 and improve quantum efficiency (QE), that is, the sensitivity of the pixel 10 for infrared rays.

3. MODIFICATION EXAMPLE OF FIRST CONFIGURATION EXAMPLE

Figure 4:
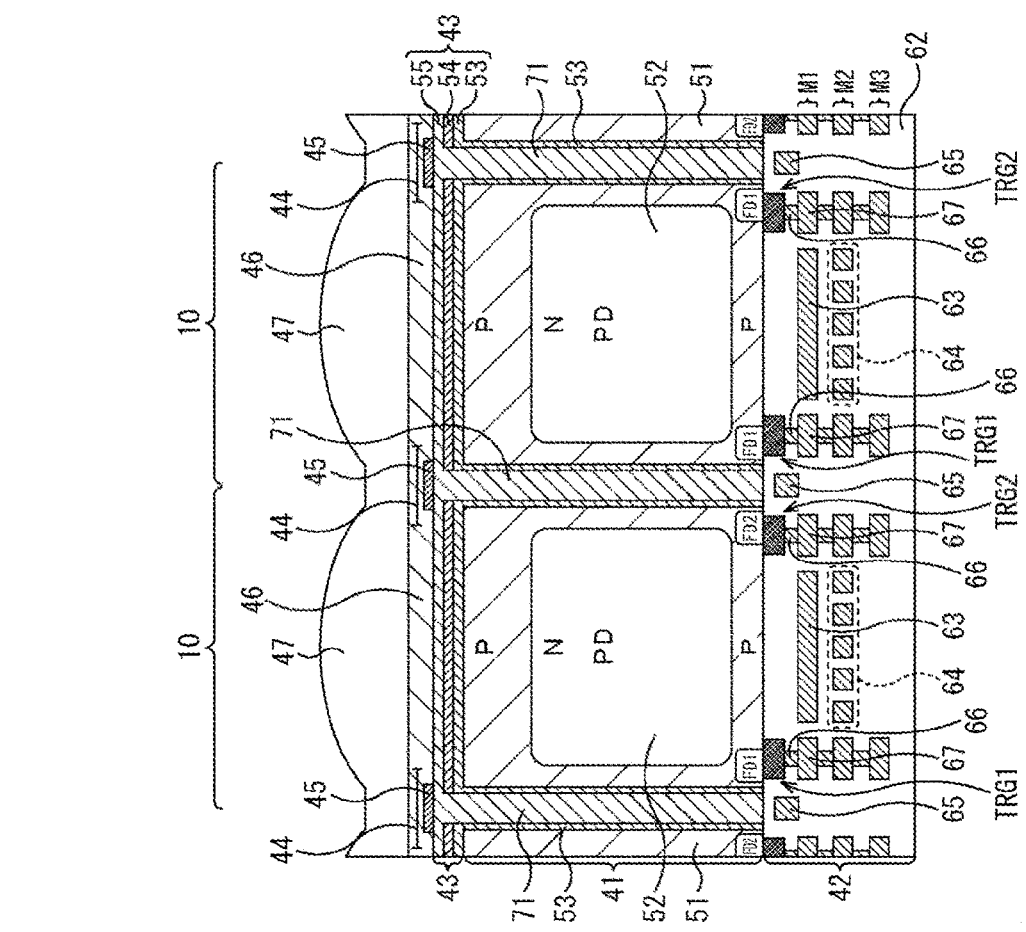
FIG. 4 is a cross-sectional view illustrating a modification example of the first configuration example of pixels.

FIG. 4 is a cross-sectional view illustrating a modification example of the pixel 10 according to the first configuration example illustrated in FIG. 2.

In FIG. 4, portions corresponding to those in the first configuration example illustrated in FIG. 2 are denoted by the same reference numerals and signs, and description of the portions will be appropriately omitted.

The modification example of FIG. 4 is different from the first configuration example of FIG. 2 in that the inter-pixel separation portion 61, which is a deep trench isolation (DTI) formed by being dug from the rear surface side (on-chip lens 47 side) of the semiconductor substrate 41, is replaced with an inter-pixel separation portion 71 penetrating the semiconductor substrate 41, but other aspects thereof are the same as in the modification example and the first configuration example.

The inter-pixel separation portion 71 is formed by forming a trench to penetrate a portion ranging from the rear surface side (on-chip lens 47 side) or the surface side of the semiconductor substrate 41 to the substrate surface on the opposite side and embedding the silicon oxide film 55, which is a material of the uppermost layer of the antireflection film 43, in the trench. Examples of a material to be embedded in the trench as the inter-pixel separation portion 71 may include metal materials such as tungsten (W), aluminum (Al), titanium (Ti), and titanium nitride (TiN), in addition to an insulating film such as the silicon oxide film 55.

Adjacent pixels can be completely electrically separated from each other by forming such an inter-pixel separation portion 71. Thereby, incident light is prevented from penetrating the next pixel 10 to confine the light in its own pixel, and leakage of incident light from the adjacent pixel 10 is prevented. In addition, the inter-pixel light shielding unit 65 is formed at the pixel boundary portion 44 of the multi-layered wiring layer 42 to prevent incident light from leaking to an adjacent pixel due to wraparound from the multi-layered wiring layer 42.

Thus, also in the modification example of the first configuration example, it is possible to further increase the amount of infrared rays being subjected to photoelectric conversion in the semiconductor substrate 41 to improve quantum efficiency, that is, the sensitivity of the pixel 10 for infrared rays.

4. CIRCUIT CONFIGURATION EXAMPLE OF PIXEL

Figure 5:
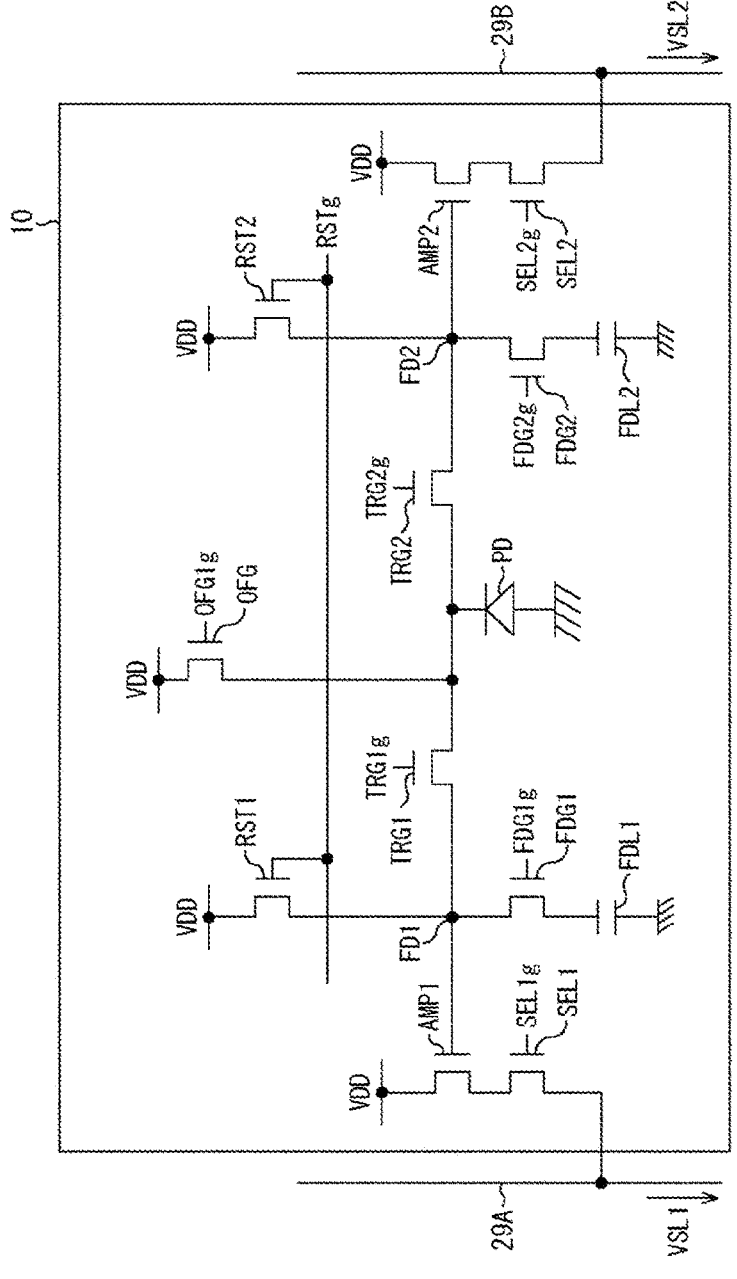
FIG. 5 is a diagram illustrating a circuit configuration example of the pixels in FIG. 2.

FIG. 5 illustrates a circuit configuration of the pixel 10 which is two-dimensionally disposed in the pixel array portion 21.

The pixel 10 includes the photodiode PD as a photoelectric conversion element. In addition, the pixel 10 includes two transfer transistors TRG, two floating diffusion regions FD, two additional capacitors FDL, two switching transistors FDG, two amplification transistors AMP, two reset transistors RST, and two selection transistors SEL. Further, the pixel 10 includes a charge discharging transistor OFG.

Here, in a case where the two transfer transistors TRG, the two floating diffusion regions FD, the two additional capacitors FDL, the two switching transistors FDG, the two amplification transistors AMP, the two reset transistors RST, and the two selection transistors SEL which are provided in the pixel 10 are distinguished from each other, they are respectively referred to as transfer transistors TRG1 and TRG2, floating diffusion regions FD1 and FD2, additional capacitors FDL1 and FDL2, switching transistors FDG1 and FDG2, amplification transistors AMP1 and AMP2, reset transistors RST1 and RST2, and selection transistors SEL1 and SEL2 as illustrated in FIG. 5.

The transfer transistor TRG, the switching transistor FDG, the amplification transistor AMP, the selection transistor SEL, the reset transistor RST, and the charge discharging transistor OFG are constituted by, for example, an N-type MOS transistor.

The transfer transistor TRG1 is set to be in an electrical conduction state in response to a transfer drive signal TRG1g when the transfer drive signal TRG1g supplied to a gate electrode is set to be in an active state, and thus the transfer transistor TRG1 transfers charge accumulated in the photodiode PD to the floating diffusion region FD1. The transfer transistor TRG2 is set to be in an electrical conduction state in response to a transfer drive signal TRG2g when the transfer drive signal TRG2g supplied to a gate electrode is set to be in an active state, and thus the transfer transistor transfers charge accumulated in the photodiode PD to the floating diffusion region FD2.

The floating diffusion regions FD1 and FD2 are charge accumulation portions that temporarily hold the charge transferred from the photodiode PD.

The switching transistor FDG1 is set to be in an electrical conduction state in response to an FD drive signal FDG1g when the FD drive signal FDG1g supplied to a gate electrode is set to be in an active state, and thus the switching transistor FDG1 connects the additional capacitor FDL1 to the floating diffusion region FD1. The switching transistor FDG2 is set to be in an electrical conduction state in response to an FD drive signal FDG2g when the FD drive signal FDG2g supplied to a gate electrode is set to be in an active state, and thus the switching transistor FDG2 connects the additional capacitor FDL2 to the floating diffusion region FD2. The additional capacitors FDL1 and FDL2 are constituted by the wiring capacitance 64 in FIG. 2.

The reset transistor RST1 resets the potential of the floating diffusion region FD1 by being set to be in an electrical conduction state in response to a reset drive signal RSTg when the reset drive signal RSTg supplied to a gate electrode is set to be in an active state. The reset transistor RST2 resets the potential of the floating diffusion region FD2 by being set to be in an electrical conduction state in response to a reset drive signal RSTg when the reset drive signal RSTg supplied to a gate electrode is set to be in an active state. Note that, when the reset transistors RST1 and RST2 are set to be in an active state, the switching transistors FDG1 and FDG2 are also set to be in an active state at the same time, and the additional capacitors FDL1 and FDL2 are also reset.

The vertical drive unit 22 sets the switching transistors FDG1 and FDG2 to be in an active state, for example, in the case of high illuminance with a large amount of incident light to connect the floating diffusion region FD1 and the additional capacitor FDL1 and connect the floating diffusion region FD2 and the additional capacitor FDL2. Accordingly, a larger amount of charges can be accumulated when the illuminance is high.

On the other hand, in the case of low illuminance with a small amount of incident light, the vertical drive unit 22 sets the switching transistors FDG1 and FDG2 to be in an inactive state to separate the additional capacitors FDL1 and FDL2 from the floating diffusion regions FD1 and FD2. Accordingly, conversion efficiency can be improved.

The charge discharging transistor OFG discharges charge accumulated in the photodiode PD by being set to be in an electrical conduction state in response to a discharge drive signal OFG1g when the discharge drive signal OFG1g supplied to a gate electrode is set to be in an active state.

The amplification transistor AMP1 is connected to a constant current source not illustrated in the drawing by a source electrode being connected to a vertical signal line 29A through the selection transistor SEL1, thereby constituting a source follower circuit. The amplification transistor AMP2 is connected to a constant current source not illustrated in the drawing by a source electrode being connected to a vertical signal line 29B through the selection transistor SEL2, thereby constituting a source follower circuit.

The selection transistor SEL1 is connected between the source electrode of the amplification transistor AMP1 and the vertical signal line 29A. The selection transistor SEL1 is set to be in an electrical conduction state in response to a selection signal SEL1g when the selection signal SEL1g supplied to a gate electrode is set to be in an active state, and outputs a detection signal VSL1 output from the amplification transistor AMP1 to the vertical signal line 29A.

The selection transistor SEL2 is connected between the source electrode of the amplification transistor AMP2 and the vertical signal line 29B. The selection transistor SEL2 is set to be in an electrical conduction state in response to a selection signal SEL2g when the selection signal SEL2g supplied to a gate electrode is set to be in an active state, and outputs a detection signal VSL2 output from the amplification transistor AMP2 to the vertical signal line 29B.

The transfer transistors TRG1 and TRG2, the switching transistors FDG1 and FDG2, the amplification transistors AMP1 and AMP2, the selection transistors SEL1 and SEL2, and the charge discharging transistor OFG of the pixel 10 are controlled by the vertical drive unit 22.

In a pixel circuit of FIG. 5, the additional capacitors FDL1 and FDL2 and the switching transistors FDG1 and FDG2 controlling the connection thereof may be omitted, but a high dynamic range can be secured by providing an additional capacitor FDL and using it appropriately according to the amount of incident light.

Operations of the pixel 10 will be briefly described.

First, a reset operation for resetting charge in the pixel 10 is performed in all pixels before light reception is started. That is, the charge discharging transistor OFG, the reset transistors RST1 and RST2, and the switching transistors FDG1 and FDG2 are turned on, and charge accumulated in the photodiode PD, the floating diffusion regions FD1 and FD2, and the additional capacitors FDL1 and FDL2 is discharged.

After the accumulated charge is discharged, light reception is started in all pixels.

In a light receiving period, the transfer transistors TRG1 and TRG2 are alternately driven. That is, in a first period, control for turning on the transfer transistor TRG1 and turning off the transfer transistor TRG2 is performed. In the first period, charge generated in the photodiode PD is transferred to the floating diffusion region FD1. In a second period subsequent to the first period, control for turning off the transfer transistor TRG1 and turning on the transfer transistor TRG2 is performed. In the second period, charge generated in the photodiode PD is transferred to the floating diffusion region FD2. Thereby, charge generated in the photodiode PD is distributed to the floating diffusion regions FD1 and FD2 and accumulated therein.

Here, the transfer transistor TRG and the floating diffusion region FD where charge (electrons) obtained by photoelectric conversion is read out are also referred to as active taps.

In contrast, the transfer transistor TRG and the floating diffusion region FD where charge obtained by photoelectric conversion is not read out are also referred to as inactive taps.

In addition, when the light receiving period ends, the pixels 10 of the pixel array portion 21 are line-sequentially selected. In the selected pixel 10, selection transistors SEL1 and SEL2 are turned on. Thereby, charge accumulated in the floating diffusion region FD1 is output to the column processing unit 23 through the vertical signal line 29A as a detection signal VSL1. Charge accumulated in the floating diffusion region FD2 is output to the column processing unit 23 through the vertical signal line 29B as a detection signal VSL2.

As described above, one light receiving operation is terminated, and the next light receiving operation starting from a reset operation is executed.

Reflected light received by the pixel 10 is delayed in accordance with a distance to an object from a timing when a light source emits light. A distribution ratio of charge accumulated in the two floating diffusion regions FD1 and FD2 changes depending on a delay time according to the distance to the object, and thus the distance to the object can be obtained from the distribution ratio of charge accumulated in the two floating diffusion regions FD1 and FD2.

5. PLAN VIEW OF PIXEL

Figure 6:
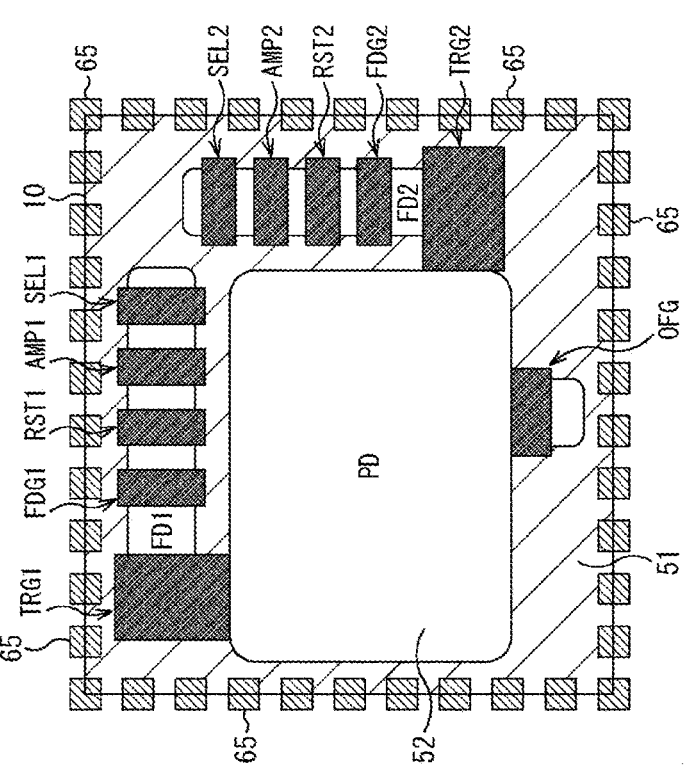
FIG. 6 is a plan view illustrating an example of arrangement of a pixel circuit in FIG. 4.

FIG. 6 is a plan view illustrating an example of arrangement of a pixel circuit illustrated in FIG. 5.

A transverse direction in FIG. 6 corresponds to a row direction (horizontal direction) in FIG. 1, and a longitudinal direction corresponds to a column direction (vertical direction) in FIG. 1.

As illustrated in FIG. 6, the photodiode PD is constituted by an N-type semiconductor region 52 in a central region of a rectangular pixel 10.

The transfer transistor TRG1, the switching transistor FDG1, the reset transistor RST1, the amplification transistor AMP1, and the selection transistor SEL1 are linearly disposed to be lined up on the outer side of the photodiode PD and along one predetermined side among four sides of the rectangular pixel 10, and the transfer transistor TRG2, the switching transistor FDG2, the reset transistor RST2, the amplification transistor AMP2, and the selection transistor SEL2 are linearly disposed to be lined up along another side among the four sides of the rectangular pixel 10.

Further, the charge discharging transistor OFG is disposed at a side different from the two sides of the pixel 10 where the transfer transistors TRG, the switching transistors FDG, the reset transistors RST, the amplification transistors AMP, and the selection transistors SEL are formed.

The inter-pixel light shielding unit 65 is configured, for example, by disposing light shielding members having the same size and planar shape as those of the gate contact 66 on boundary lines of the pixels 10 at predetermined intervals. In the example of FIG. 6, the planar shape of one light shielding member constituting the inter-pixel light shielding unit 65 is a rectangular shape, but it may be a rectangular shape with rounded corners, an elliptical shape, or a circular shape.

Figure 7:
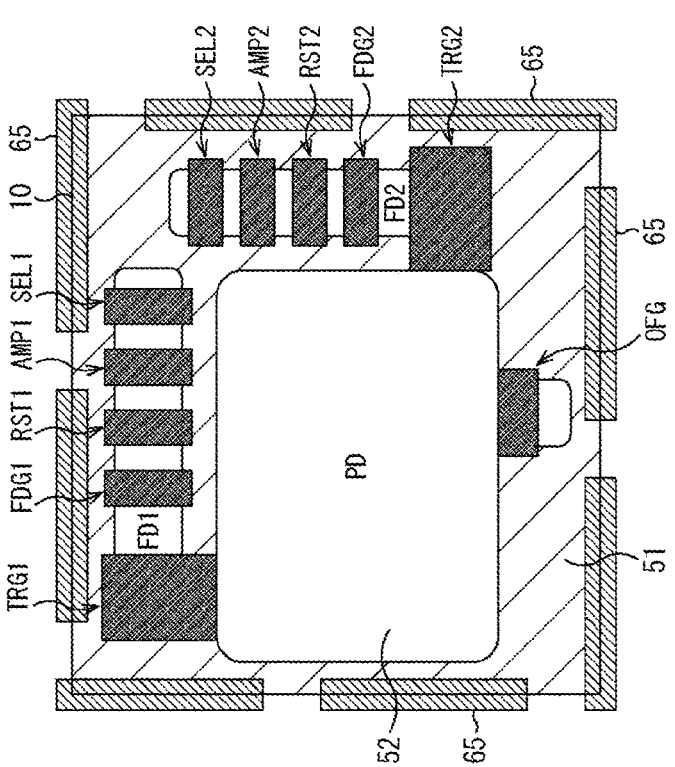
FIG. 7 is a plan view illustrating other examples of formation of the inter-pixel light shielding unit.
Figure 8:
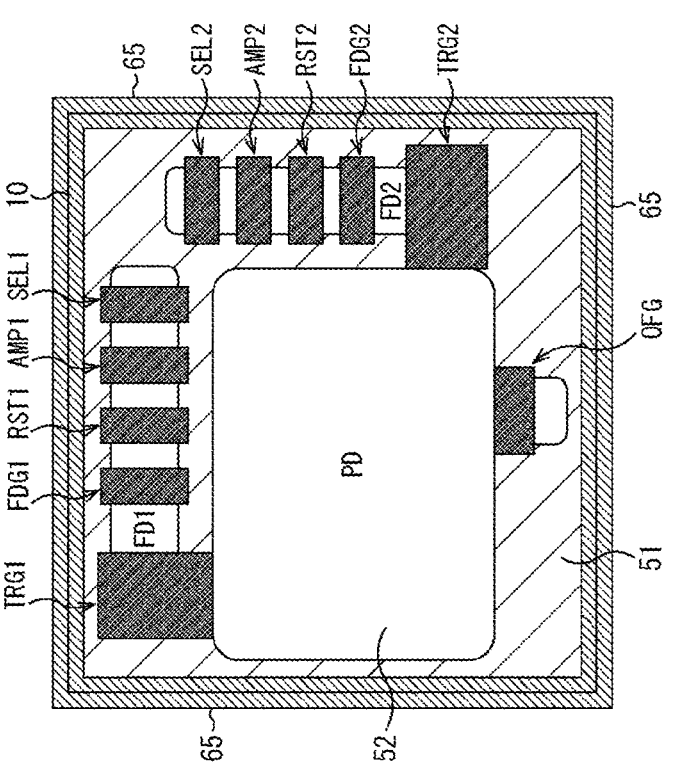
FIG. 8 is a plan view illustrating other examples of formation of the inter-pixel light shielding unit.

FIGS. 7 and 8 are diagrams illustrating other examples of formation of the inter-pixel light shielding unit 65.

As illustrated in FIG. 7, the inter-pixel light shielding unit 65 may be configured such that the linear light shielding members having a planar shape long in the direction of the boundary line of the pixel 10 and short in the direction in which the pixel 10 is adjacent to other pixels 10 are disposed on the boundary lines of the pixels 10 at predetermined intervals.

Alternatively, as illustrated in FIG. 8, the inter-pixel light shielding unit 65 may be configured such that the light shielding members are disposed on the boundary lines of the pixels 10 to surround the entire circumference of the pixels 10.

6. OTHER CIRCUIT CONFIGURATION EXAMPLES OF PIXEL

Figure 9:
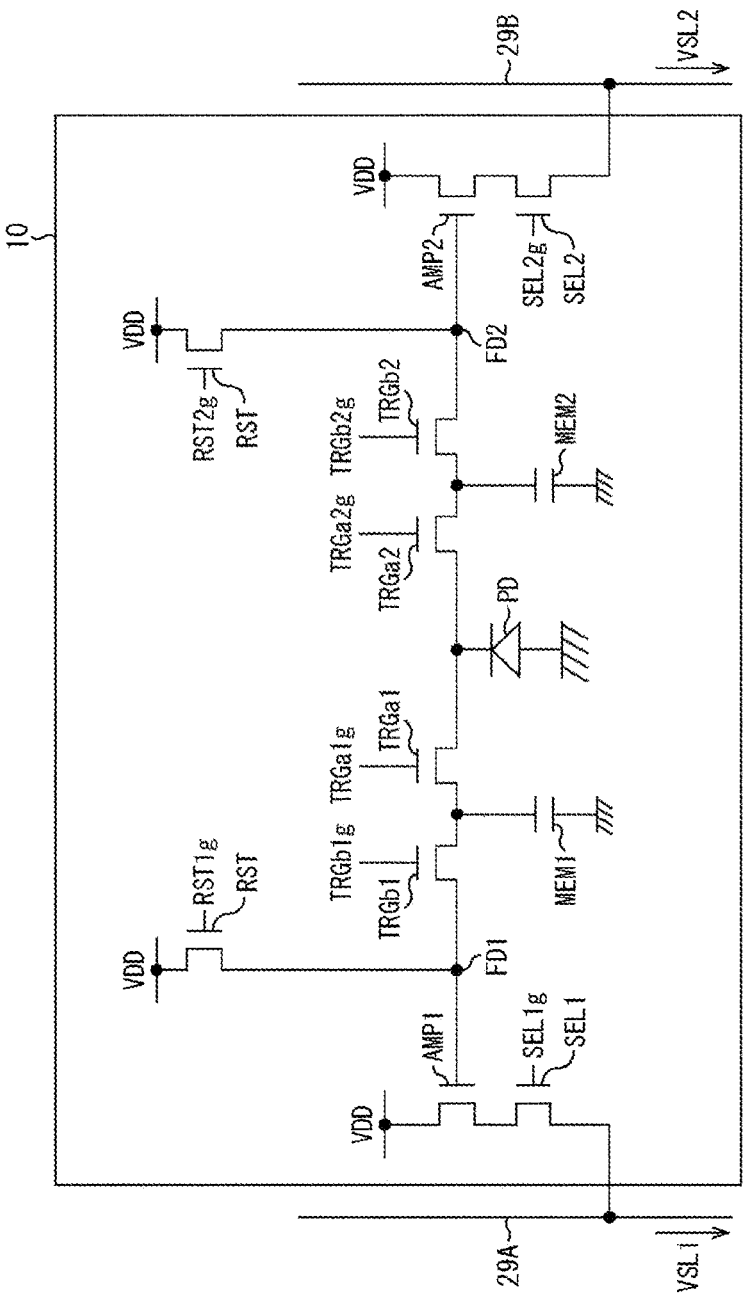
FIG. 9 is a diagram illustrating other circuit configuration examples of the pixels in FIG. 2.

FIG. 9 illustrates other circuit configuration examples of the pixel 10.

In FIG. 9, portions corresponding to those in FIG. 5 are denoted by the same reference numerals and signs, and description of the portions will be appropriately omitted.

The pixel 10 includes a photodiode PD as a photoelectric conversion element. In addition, the pixel 10 includes two first transfer transistors TRGa, two second transfer transistors TRGb, two memories MEM, two floating diffusion regions FD, two reset transistors RST, two amplification transistors AMP, and two selection transistors SEL.

Here, in a case where the two first transfer transistors TRGa, the two second transfer transistors TRGb, the two memories MEM, the two floating diffusion regions FD, the two reset transistors RST, the two amplification transistors AMP, and the two selection transistors SEL which are provided in the pixel 10 are distinguished from each other, they are respectively referred to as first transfer transistors TRGa1 and TRGa2, second transfer transistors TRGb1 and TRGb2, transfer transistors TRG1 and TRG2, memories MEM1 and MEM2, floating diffusion regions FD1 and FD2, amplification transistors AMP1 and AMP2, and selection transistors SEL1 and SEL2 as illustrated in FIG. 9.

Thus, comparing the pixel circuit in FIG. 5 with the pixel circuit in FIG. 9, the transfer transistors TRG are changed to two types, that is, a first transfer transistor TRGa and a second transfer transistor TRGb, and the memories MEM are added. In addition, the additional capacitor FDL and the switching transistor FDG are omitted.

The first transfer transistor TRGa, the second transfer transistor TRGb, the reset transistor RST, the amplification transistor AMP, and selection transistor SEL are constituted by, for example, an N-type MOS transistor.

In the pixel circuit illustrated in FIG. 5, charge generated by the photodiode PD is transferred to the floating diffusion regions FD1 and FD2 and is held therein. However, in the pixel circuit illustrated in FIG. 9, charge is transferred to the memories MEM1 and MEM2 provided as charge accumulation portions and is held therein.

That is, the first transfer transistor TRGa1 is set to be in an electrical conduction state in response to a first transfer drive signal TRGa1g when the first transfer drive signal TRGa1g supplied to a gate electrode is set to be in an active state, and thus the first transfer transistor TRGa1 transfers charge accumulated in the photodiode PD to the memory MEM1. The first transfer transistor TRGa2 is set to be in an electrical conduction state in response to a first transfer drive signal TRGa2g when the first transfer drive signal TRGa2g supplied to a gate electrode is set to be in an active state, and thus the first transfer transistor TRGa2 transfers charge accumulated in the photodiode PD to the memory MEM2.

In addition, the second transfer transistor TRGb1 is set to be in an electrical conduction state in response to a second transfer drive signal TRGb1g when the second transfer drive signal TRGb1g supplied to a gate electrode is set to be in an active state, and thus the second transfer transistor TRGb1 transfers charge accumulated in the memory MEM1 to the floating diffusion region FD1. The second transfer transistor TRGb2 is set to be in an electrical conduction state in response to a second transfer drive signal TRGb2g when the second transfer drive signal TRGb2g supplied to a gate electrode is set to be in an active state, and thus the second transfer transistor TRGb2 transfers charge accumulated in the memory MEM2 to the floating diffusion region FD2.

The reset transistor RST1 is set to be in an electrical conduction state in response to a reset drive signal RST1g when the reset drive signal RST1g supplied to a gate electrode is set to be in an active state, and thus the reset transistor RST1 resets the potential of the floating diffusion region FD1. The reset transistor RST2 is set to be in an electrical conduction state in response to a reset drive signal RST2g when the reset drive signal RST2g supplied to a gate electrode is set to be in an active state, and thus the reset transistor RST2 resets the potential of the floating diffusion region FD2. Note that, when the reset transistors RST1 and RST2 are set to be in an active state, the second transfer transistors TRGb1 and TRGb2 are also set to be in an active state at the same time, and the memories MEM1 and MEM2 are also reset.

In the pixel circuit illustrated in FIG. 5, charge generated by the photodiode PD is distributed to the memories MEM1 and MEM2 and is accumulated therein. In addition, charge held in the memories MEM1 and MEM2 is transferred to the floating diffusion regions FD1 and FD2 at a timing when the charge is read out, and is output from the pixels 10.

7. PLAN VIEW OF PIXEL

Figure 10:
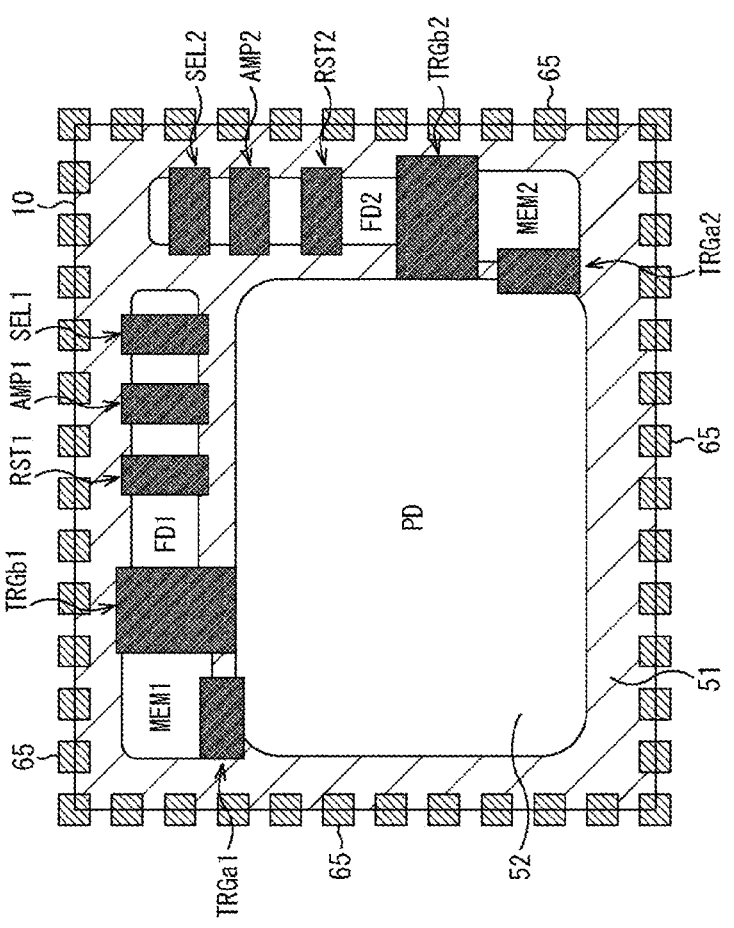
FIG. 10 is a plan view illustrating an example of arrangement of a pixel circuit in FIG. 9.

FIG. 10 is a plan view illustrating an example of arrangement of the pixel circuit illustrated in FIG. 9.

A transverse direction in FIG. 10 corresponds to a row direction (horizontal direction) in FIG. 1, and a longitudinal direction corresponds to a column direction (vertical direction) in FIG. 1.

As illustrated in FIG. 10, the photodiode PD is constituted by an N-type semiconductor region 52 in a central region of a rectangular pixel 10.

The first transfer transistor TRGa1, the second transfer transistor TRGb1, the reset transistor RST1, the amplification transistor AMP1, and the selection transistor SEL1 are linearly disposed to be lined up on the outer side of the photodiode PD and along one predetermined side among four sides of the rectangular pixel 10, and the first transfer transistor TRGa2, the second transfer transistor TRGb2, the reset transistor RST2, the reset transistor RST2, the amplification transistor AMP2, and the selection transistor SEL2 are linearly disposed to be lined up along another side among the four sides of the rectangular pixel 10. The memories MEM1 and MEM2 are constituted by, for example, an embedded N-type diffusion region.

As the inter-pixel light shielding unit 65, a configuration in which light shielding members having the same planar shape as that of the gate contact 66 are disposed at equal intervals, illustrated in FIG. 6, has been adopted, but configurations illustrated in FIGS. 7 and 8 or other configurations may be adopted.

Note that the arrangement of the pixel circuit is not limited to the example illustrated in FIG. 6 or FIG. 10, and other arrangements can also be adopted.

8. CROSS-SECTIONAL VIEW ACCORDING TO SECOND CONFIGURATION EXAMPLE OF PIXEL

Figure 11:
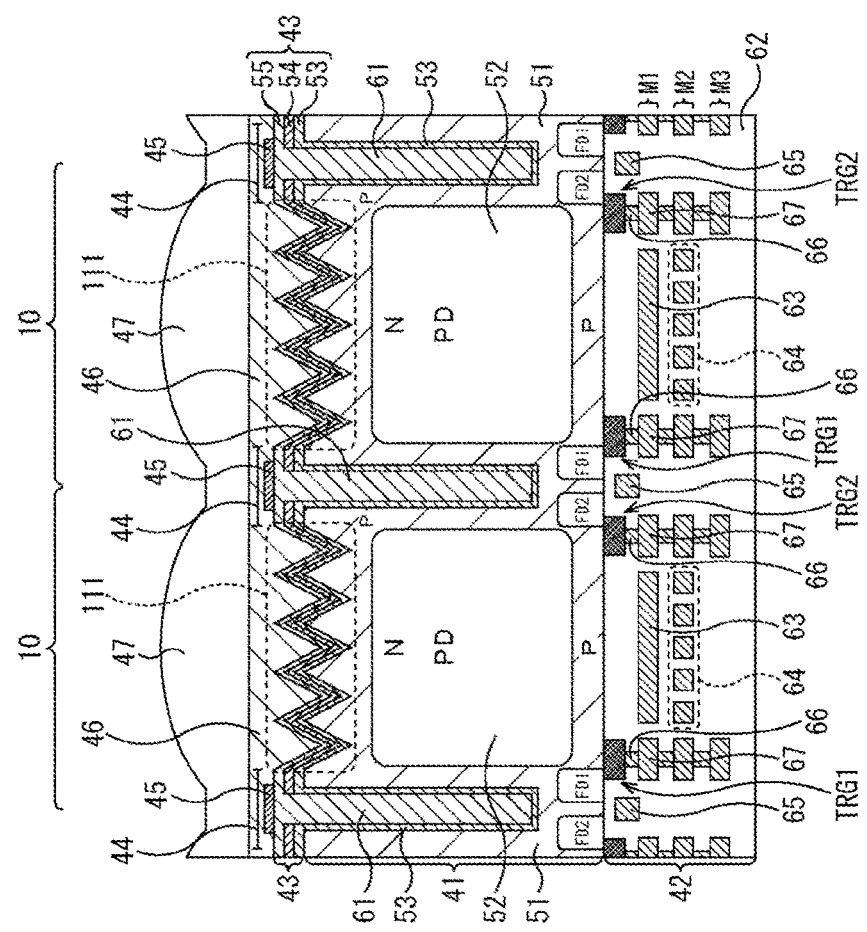
FIG. 11 is a cross-sectional view illustrating a second configuration example of pixels.

FIG. 11 is a cross-sectional view illustrating a second configuration example of the pixel 10.

In FIG. 11, portions corresponding to those in the first configuration example illustrated in FIG. 2 are denoted by the same reference numerals and signs, and description of the portions will be appropriately omitted.

In the second configuration example of FIG. 11, a moth eye structure portion 111 in which fine irregularities are periodically formed is formed on the rear surface of the semiconductor substrate 41 and above a region where the photodiode PD is formed. In addition, the antireflection film 43 formed on the upper surface of a moth eye structure portion 111 of the semiconductor substrate 41 is also formed to have a moth eye structure to correspond to the moth eye structure portion 111.

The moth eye structure portion 111 of the semiconductor substrate 41 is configured such that, for example, regions of a plurality of quadrangular pyramids having substantially the same shape and substantially the same size are regularly provided (in a grid pattern).

The moth eye structure portion 111 is formed to have, for example, an inverted pyramid structure in which a plurality of regions having a quadrangular pyramid shape having vertices on the photodiode PD side are arranged to be lined up regularly.

Alternatively, the moth eye structure portion 111 may have a forward pyramid structure in which regions of a plurality of quadrangular pyramids having vertices on the on-chip lens 47 side are arranged to be lined up regularly. The sizes and arrangement of the plurality of quadrangular pyramids may be formed randomly instead of being regularly arranged. In addition, concave portions or convex portions of the quadrangular pyramids of the moth eye structure portion 111 have a certain degree of curvature and may have a rounded shape. The moth eye structure portion 111 is only required to have a structure in which a concave-convex structure is repeated periodically or randomly, and the shape of the concave portion or the convex portion is arbitrary.

Figure 12:
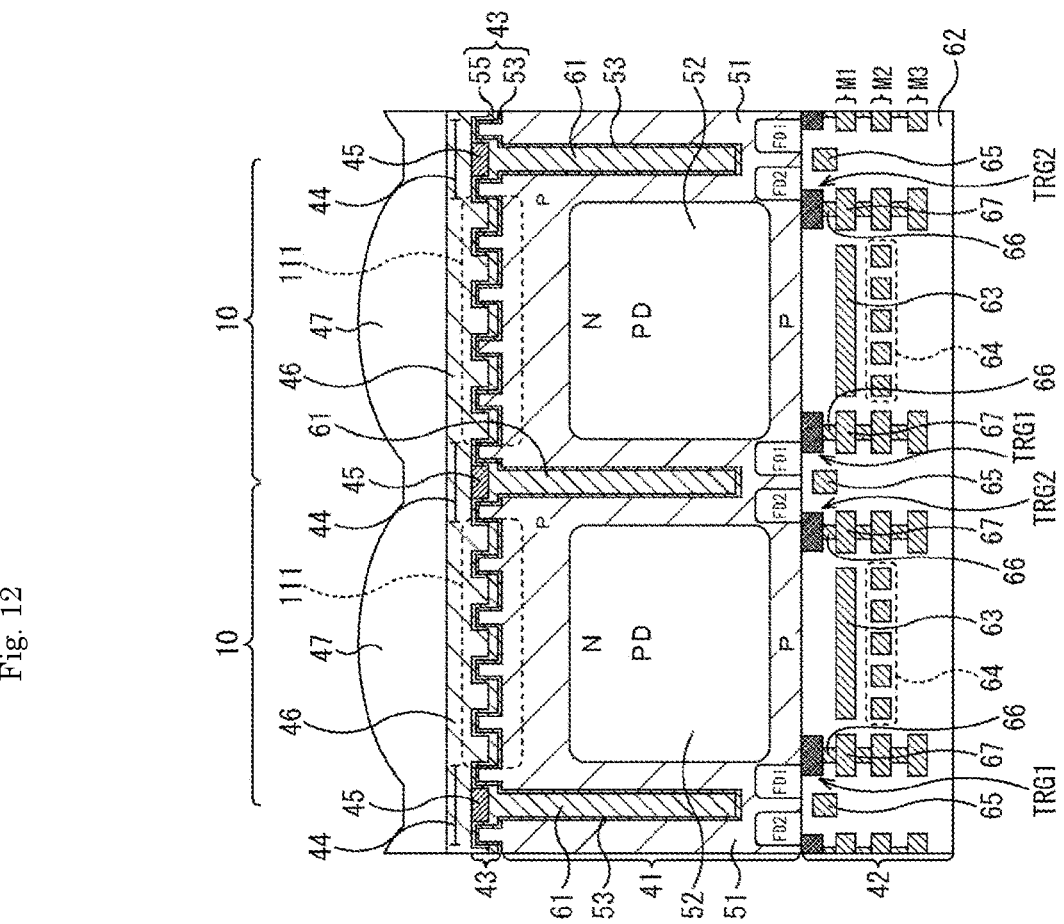
FIG. 12 is a cross-sectional view illustrating another example of formation of a moth eye structure portion.

FIG. 12 is a cross-sectional view illustrating another example of formation of the moth eye structure portion 111.

In the example of FIG. 12, the shape of the moth eye structure portion 111 has a surface parallel to the semiconductor substrate 41, and has a concave-convex structure in which concave portions dug with a fixed amount in a depth direction of the substrate are arranged to be lined up at regular intervals. Note that, in FIG. 12, the antireflection film 43 is constituted by two layers, that is, the hafnium oxide film 53 and the silicon oxide film 55, but may be constituted by three layers similar to the other configuration examples or may be constituted by a single layer.

As in FIGS. 11 and 12, the moth eye structure portion 111 is formed on the light incident surface of the semiconductor substrate 41 as a diffraction structure that diffracts incident light, and thus it is possible to alleviate a sudden change in a refractive index at an interface of the substrate and reduce the influence of reflected light.

The other configurations of the second configuration example are the same as those of the first configuration example.

Also in FIGS. 11 and 12, the inter-pixel light shielding unit 65 is formed at the pixel boundary portion 44 of the multi-layered wiring layer 42 to prevent leakage of incident light to an adjacent pixel due to wraparound from the multi-layered wiring layer 42.

Thus, also in the second configuration example, it is possible to further increase the amount of infrared rays being subjected to photoelectric conversion in the semiconductor substrate 41 to improve quantum efficiency, that is, the sensitivity of the pixel 10 for infrared rays.

9. CROSS-SECTIONAL VIEW ACCORDING TO THIRD CONFIGURATION EXAMPLE OF PIXEL

Figure 13:
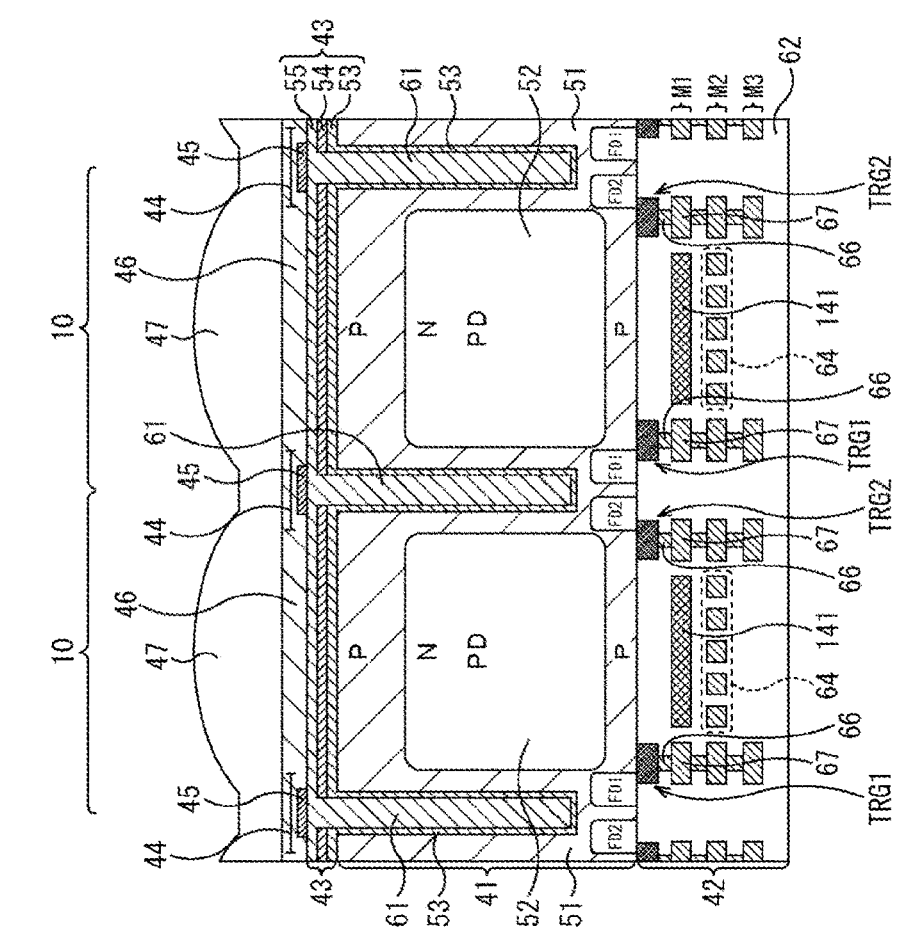
FIG. 13 is a cross-sectional view illustrating a third configuration example of pixels.

FIG. 13 is a cross-sectional view illustrating a third configuration example of the pixel 10.

In the above-described first and second configuration examples, a configuration in which leakage of incident light to an adjacent pixel due to wraparound from the multi-layered wiring layer 42 is prevented has been described, but in the third configuration example, a configuration in which leakage of incident light to an adjacent pixel due to wraparound from the on-chip lens 47 side is prevented will be described.

In FIG. 13, portions corresponding to those in the first configuration example illustrated in FIG. 2 are denoted by the same reference numerals and signs, and description of the portions will be appropriately omitted.

In the third configuration example illustrated in FIG. 13, the reflection film 63 formed at the same layer as that of the first metal film M1 below the region where the photodiode PD is formed in FIG. 2 is changed to a reflection film 141. In addition, the inter-pixel light shielding unit 65 formed at the pixel boundary portion 44 of the multi-layered wiring layer 42 in FIG. 2 is omitted.

A material for forming the reflection film 141 in the third configuration example is different from a material for forming the reflection film 63 in the first configuration example. Specifically, in the first configuration example, the reflection film 141 is formed of the same material (for example, copper, aluminum, or the like) as that of the metal wiring 67 which is electrically connected to the gate of the transfer transistor TRG1 or TRG2, but in the third configuration example, the reflection film 141 may be formed of a material different from that of the metal wiring 67. For example, in a case where the metal wiring 67 is formed of copper, the reflection film 141 is formed of aluminum, tungsten (W), platinum (Pt), nickel (Ni), or the like.

A material for forming the reflection film 141 can be determined in accordance with, for example, the thickness of the semiconductor substrate 41. For example, when the semiconductor substrate 41 has a large thickness (for example, when the thickness is 6 μm or greater), aluminum can be adopted as the material of the reflection film 141. In addition, for example, when the semiconductor substrate 41 has a small thickness (for example, when the thickness is less than 6 μm), tungsten, platinum, nickel, or the like can be adopted as the material of the reflection film 141.

In other words, for example, when the semiconductor substrate 41 has a large thickness (for example, when the thickness is 6 μm or greater), a material having a relatively high reflectance (for example, a material having a reflectance higher than 70%) can be adopted as the material of the reflection film 141. In addition, for example, when the semiconductor substrate 41 has a small thickness (for example, when the thickness is less than 6 μm), a material having a relatively low reflectance (for example, a material having a reflectance of 30% to 70% or less) can be adopted as the material of the reflection film 141.

As the material for forming the reflection film 141, a material having a reflectance (refractive index) lower than those of the materials of the other metal wirings 67 of the first metal film M1 in at least a wavelength range of infrared rays is used. Examples of such a material include metals such as Al, Ni, Cr, Fe, Pt, Rh, and Sn, alloys thereof, metal compounds such as Ta2O5, Al2O3, and Si3N4, and the like.

The other configurations of the third configuration example are the same as those of the first configuration example.

Reflected light received by the light receiving element 1 is infrared rays having a wavelength of approximately 780 nm to 1000 nm, and is less absorbed by silicon which is the semiconductor substrate 41 and has low quantum efficiency. For this reason, light incident on the semiconductor substrate 41 penetrates the semiconductor substrate 41 and is reflected again toward the semiconductor substrate 41 by the reflection film 141. In this case, when the reflectance of the reflection film 141 is as high as it is close to 100%, light reflected by the reflection film 141 further penetrates the light incident surface of the semiconductor substrate 41, is reflected by the on-chip lens 47, and leaks into an adjacent pixel 10 as indicated by a solid arrow in FIG. 14, which may result in flare.

Figure 14:
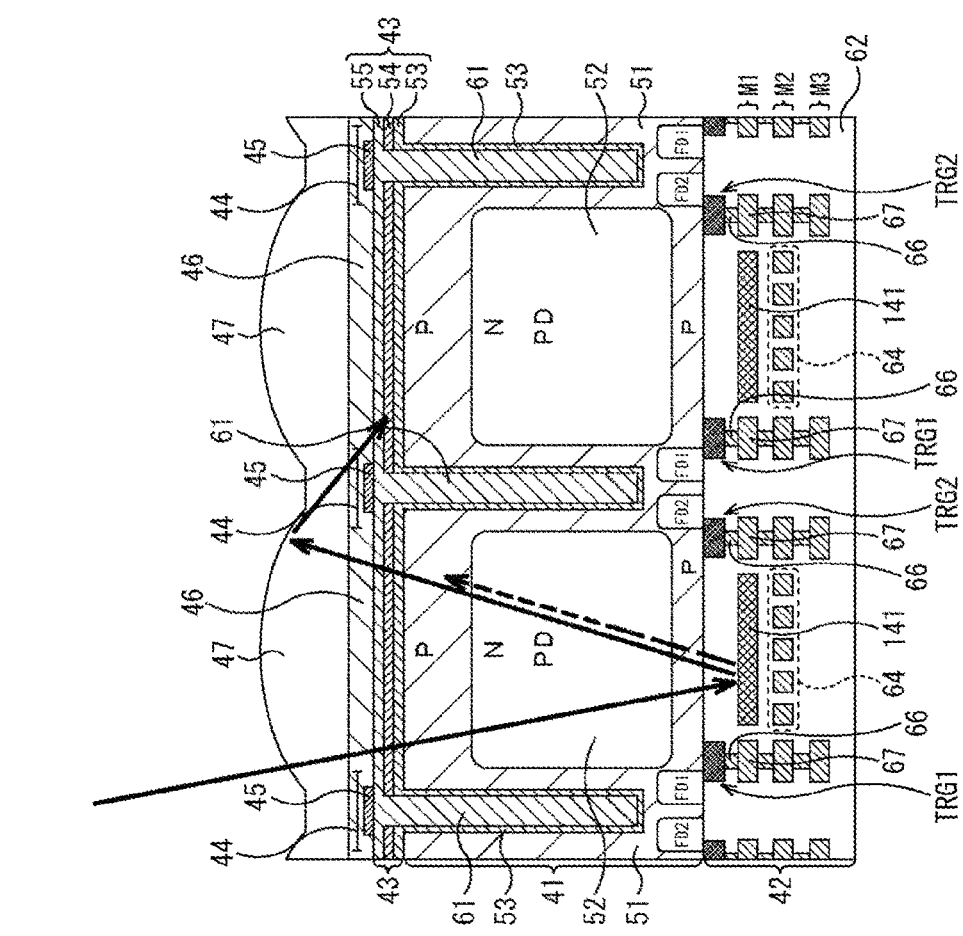
FIG. 14 is a diagram illustrating effects of a reflection film in FIG. 13.

According to the third configuration example, the reflection film 141 is formed of a material having a reflectance lower than those of the materials of the other metal wirings 67 of the first metal film M1 and is formed to have a reflectance lower than those of the other metal wirings 67 in accordance with the thickness of the semiconductor substrate 41, and thus it is possible to perform adjustment so that all light beams reflected by the reflection film 141 are absorbed in the semiconductor substrate 41 as indicated by a dashed arrow in FIG. 14. Thereby, light reflected by the reflection film 141 can be prevented from further penetrating the light incident surface of the semiconductor substrate 41, and thus it is possible to prevent leakage of incident light to an adjacent pixel due to wraparound from the on-chip lens 47 side.

With the above-described configuration, it is possible to further increase the amount of infrared rays being subjected to photoelectric conversion in the semiconductor substrate 41 to improve quantum efficiency, that is, the sensitivity of the pixel 10 for infrared rays, and to suppress the cause of flare due to reflected light penetrating the semiconductor substrate 41.

10. MODIFICATION EXAMPLE OF THIRD CONFIGURATION EXAMPLE

First Modification Example

Figure 15:
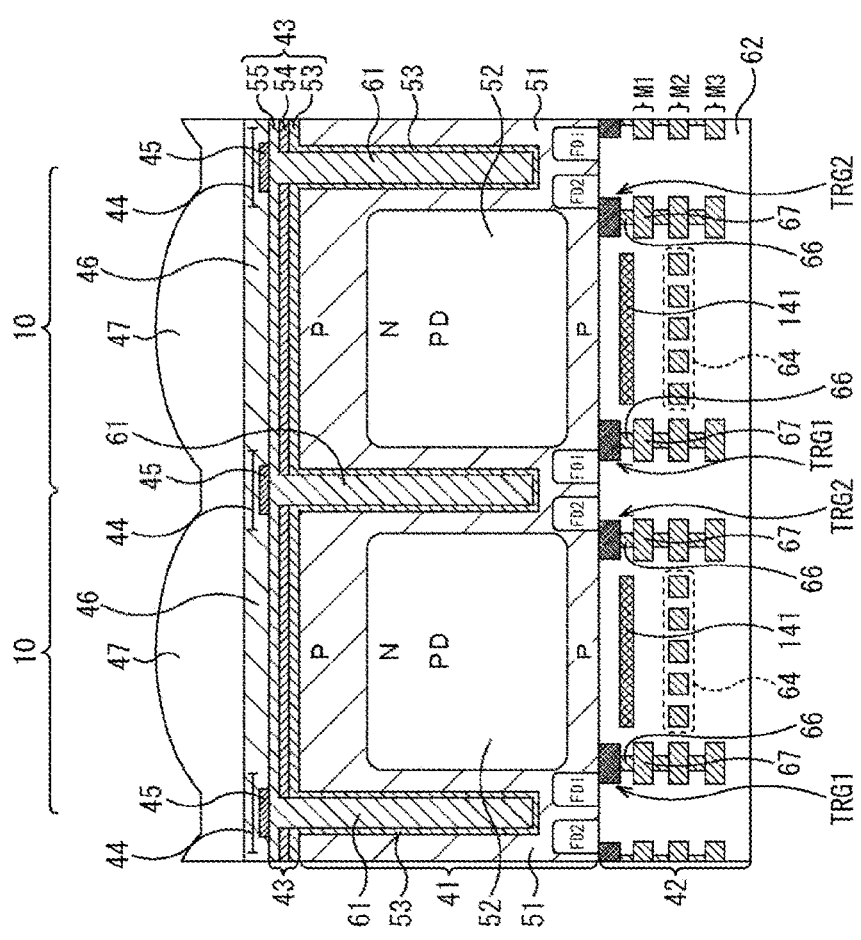
FIG. 15 is a cross-sectional view illustrating a first modification example of the third configuration example of pixels.

FIG. 15 is a cross-sectional view illustrating a first modification example of the pixel 10 according to the third configuration example illustrated in FIG. 13.

In FIG. 15, portions corresponding to those in the third configuration example illustrated in FIG. 13 are denoted by the same reference numerals and signs, and description of the portions will be appropriately omitted.

In the first modification example of FIG. 15, the position of the reflection film 141 in the depth direction of the substrate is different from that in the third configuration example illustrated in FIG. 13, and the other respects of the first modification example illustrated in FIG. 15 are common to the third configuration example illustrated in FIG. 13.

Specifically, in the third configuration example illustrated in FIG. 13, the reflection film 141 is formed at the same position (the same layer) as the first metal film M1 in the depth direction of the substrate, but the reflection film 141 is formed at a position (layer) different from that of the first metal film M1 in the first modification example of FIG. 15. Specifically, the reflection film 141 is formed on a side closer to the photodiode PD (semiconductor substrate 41 side) than the first metal film M1 in the depth direction of the substrate.

Figure 16:
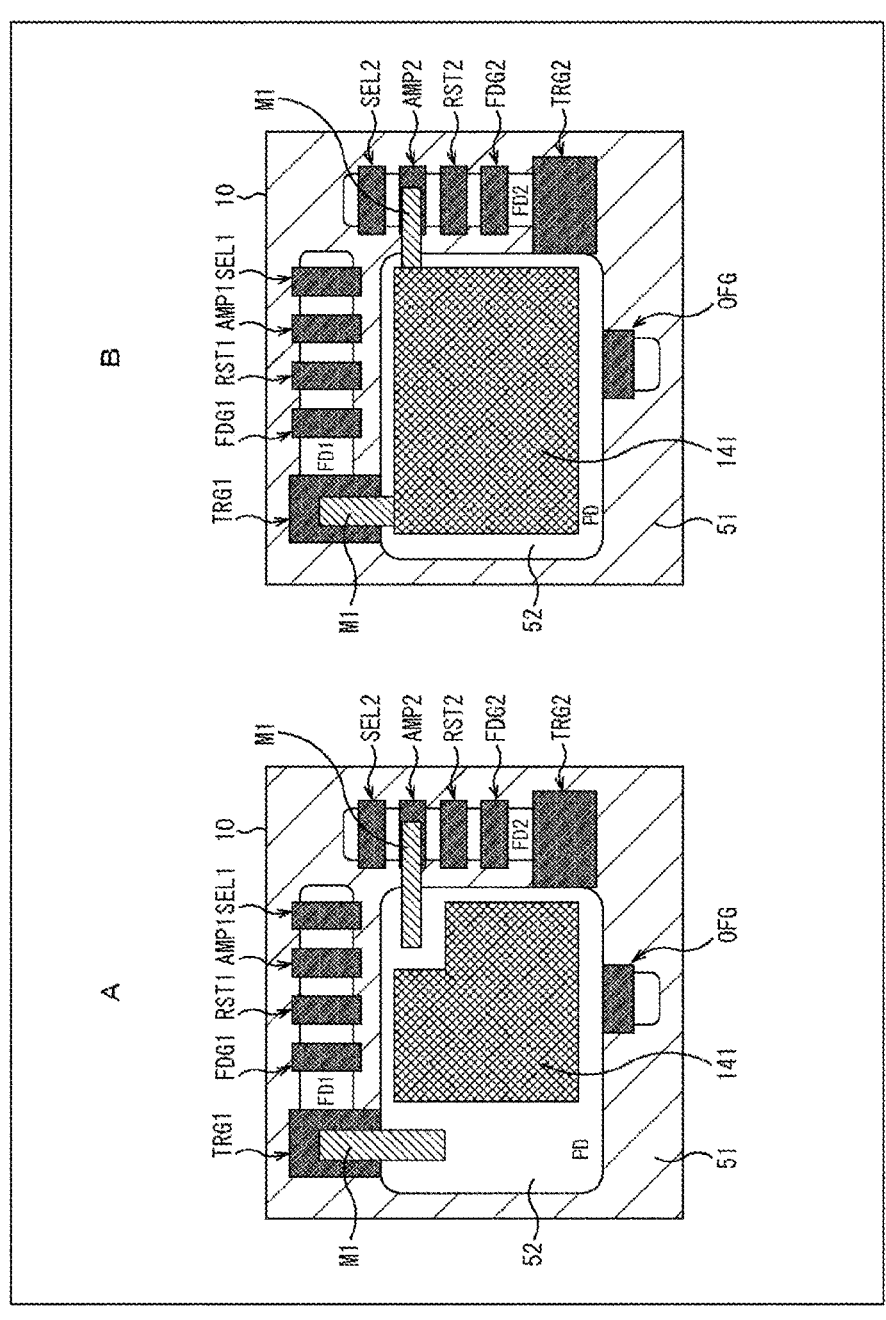
FIG. 16 is a diagram illustrating effects of a reflection film in FIG. 15.

In a case where the reflection film 141 is formed at the same layer as the first metal film M1, the reflection film 141 has to be disposed to avoid the metal wirings 67 of the first metal film M1 as illustrated in A of FIG. 16, and thus the area of the reflection film 141 when seen in a plan view is reduced.

On the other hand, in a case where the reflection film 141 is formed at a layer different from that of the first metal film M1, the metal wirings 67 of the first metal film M1 and the reflection film 141 do not interfere with each other when seen in a plan view as illustrated in B of FIG. 16, and thus the reflection film 141 can be disposed in a large size in a region overlapping the photodiode PD. Thereby, it is possible to more greatly achieve the purpose of the reflection film 63. That is, a larger amount of infrared rays having passed through the semiconductor substrate 41 without being subjected to photoelectric conversion in the semiconductor substrate 41 can be reflected by the reflection film 63 to be incident into the semiconductor substrate 41.

With the above-described configuration, it is possible to further increase the amount of infrared rays being subjected to photoelectric conversion in the semiconductor substrate 41 to improve quantum efficiency, that is, the sensitivity of the pixel 10 for infrared rays, and to suppress the cause of flare due to reflected light penetrating the semiconductor substrate 41.

Second Modification Example

Figure 17:
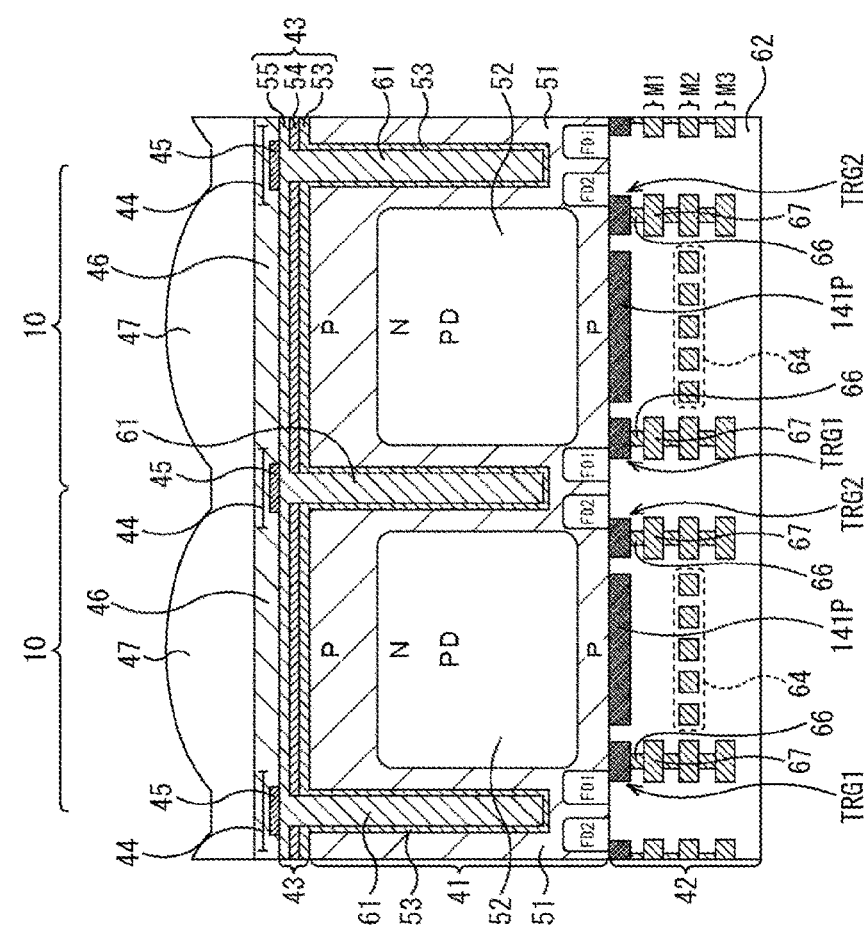
FIG. 17 is a cross-sectional view illustrating a second modification example of the third configuration example of pixels.

FIG. 17 is a cross-sectional view illustrating a second modification example of the pixel 10 according to the third configuration example illustrated in FIG. 13.

In FIG. 17, portions corresponding to those in the third configuration example illustrated in FIG. 13 are denoted by the same reference numerals and signs, and description of the portions will be appropriately omitted.

In the second modification example illustrated in FIG. 17, the reflection film 141 in the third configuration example illustrated in FIG. 13 is replaced with a reflection film 141P, and the other configurations are common to the second modification example illustrated in FIG. 17 and the third configuration example illustrated in FIG. 13.

The position of the reflection film 141P in a depth direction of the substrate is different from the position of the reflection film 141 illustrated in FIG. 13, and a material for forming the reflection film 141P is also different from the material for forming the reflection film 141.

Specifically, the reflection film 141P is formed of the same material (for example, polysilicon) as those of the gates of the transfer transistors TRG1 and TRG2 at the same depth position of the substrate as those of the gates of the transfer transistors TRG1 and TRG2. The reflection film 141P can be formed at the same time as when the gates of the transfer transistors TRG1 and TRG2 are formed by forming the reflection film 141P using the same material at the same depth position of the substrate as those of the gates of the transfer transistors TRG1 and TRG2, and thus it is possible to share steps and reduce the number of steps. Note that the reflection film 141P may be formed of polysilicon and a salicide film.

As in the first modification example of FIG. 15 and the second modification example of FIG. 17, the reflection film 141 or 141P is formed on a side closer to the photodiode PD side than the first metal film M1 in the depth direction of the substrate, and thus it is also possible to prevent leakage of incident light to an adjacent pixel due to wraparound from the multi-layered wiring layer 42.

11. CROSS-SECTIONAL VIEW ACCORDING TO FOURTH CONFIGURATION EXAMPLE OF PIXEL

Figure 18:
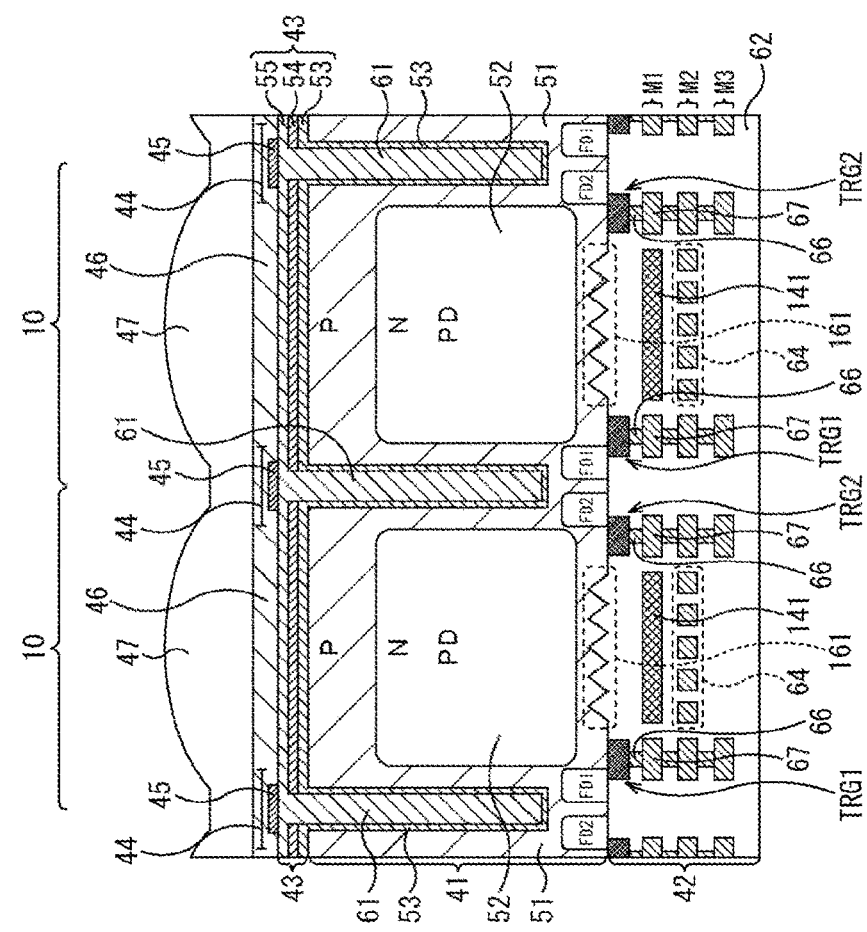
FIG. 18 is a cross-sectional view illustrating a fourth configuration example of pixels.

FIG. 18 is a cross-sectional view illustrating a fourth configuration example of the pixel 10.

In FIG. 18, portions corresponding to those in the third configuration example illustrated in FIG. 13 are denoted by the same reference numerals and signs, and description of the portions will be appropriately omitted.

In the fourth configuration example of FIG. 18, a moth eye structure portion 161 in which fine irregularities are periodically formed is further formed on a connection surface between the semiconductor substrate 41 below a region where the photodiode PD is formed and the multi-layered wiring layer 42. The moth eye structure portion 161 can be formed to have an inverted pyramid structure or a forward pyramid structure, similarly to the moth eye structure portion 111 described in FIG. 11. Alternatively, the moth eye structure portion 161 may have a concave-convex structure in which concave portions parallel to the semiconductor substrate 41 are arranged to be lined up at regular intervals, as illustrated in FIG. 12.

The other configurations of the fourth configuration example are the same as those of the third configuration example illustrated in FIG. 13.

The moth eye structure portion 161 is formed at an interface between the semiconductor substrate 41 below a region where the photodiode PD is formed and the multi-layered wiring layer 42, and thus light having penetrated the photodiode PD is diffused by the moth eye structure portion 111 and reaches the reflection film 141. Since reflection of infrared rays by the reflection film 141 is suppressed, it is possible to prevent light reflected by the reflection film 141 from further penetrating the light incident surface of the semiconductor substrate 41. As a result, it is possible to prevent leakage of incident light to an adjacent pixel due to wraparound from the on-chip lens 47 side.

12. CROSS-SECTIONAL VIEW ACCORDING TO FIFTH CONFIGURATION EXAMPLE OF PIXEL

Figure 19:
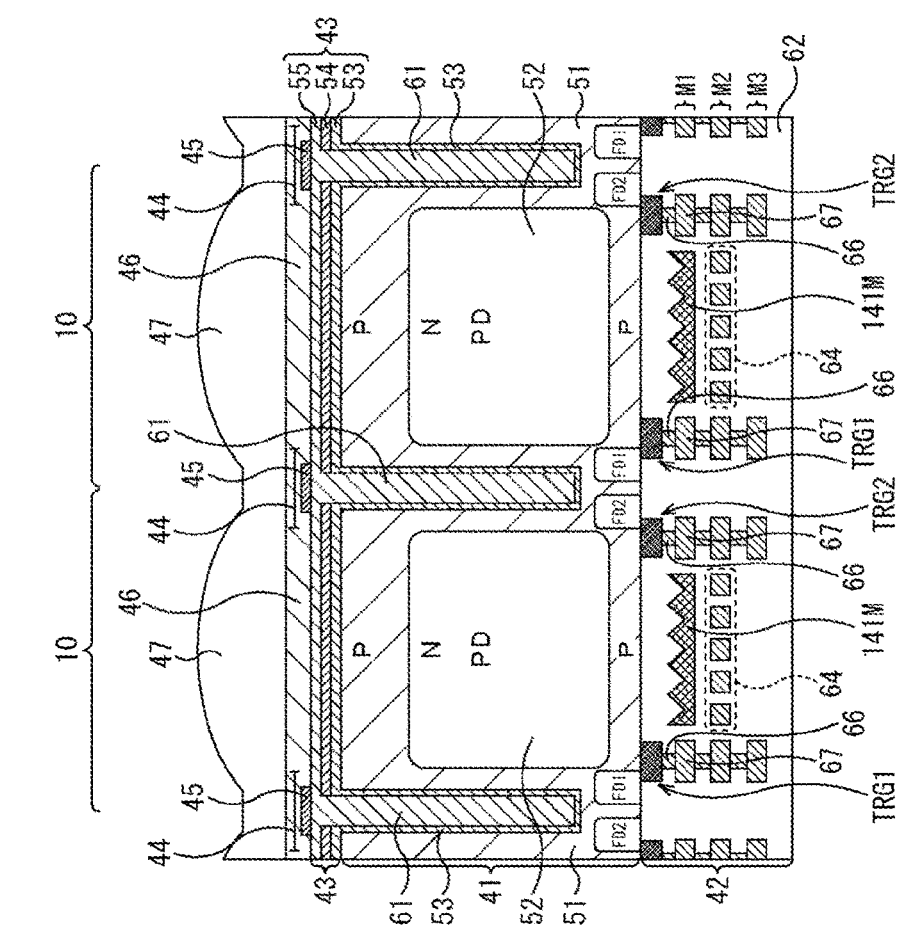
FIG. 19 is a cross-sectional view illustrating a fifth configuration example of pixels.

FIG. 19 is a cross-sectional view illustrating a fifth configuration example of the pixel 10.

In FIG. 19, portions corresponding to those in the third configuration example illustrated in FIG. 13 are denoted by the same reference numerals and signs, and description of the portions will be appropriately omitted.

In the fifth configuration example of FIG. 19, the reflection film 141 in the third configuration example illustrated in FIG. 13 is replaced with a reflection film 141M. The other configurations in FIG. 19 are the same as those in the third configuration example illustrated in FIG. 13.

The reflection film 141M is different from the reflection film 141 in that the surface shape thereof on the semiconductor substrate 41 side has a moth eye structure in which fine irregularities are periodically formed. The surface shape of the reflection film 141M on the semiconductor substrate 41 side is formed to have a moth eye structure, and thus light having penetrated the photodiode PD is diffused by the reflection film 141M and is reflected toward the semiconductor substrate 41, similarly to the fourth configuration example of FIG. 18. Thereby, reflection of infrared rays by the reflection film 141M is suppressed, and thus it is possible to prevent light reflected by the reflection film 141M from further penetrating the light incident surface of the semiconductor substrate 41. As a result, it is possible to prevent leakage of incident light to an adjacent pixel due to wraparound from the on-chip lens 47 side.

13. CROSS-SECTIONAL VIEW ACCORDING TO SIXTH CONFIGURATION EXAMPLE OF PIXEL

Figure 20:
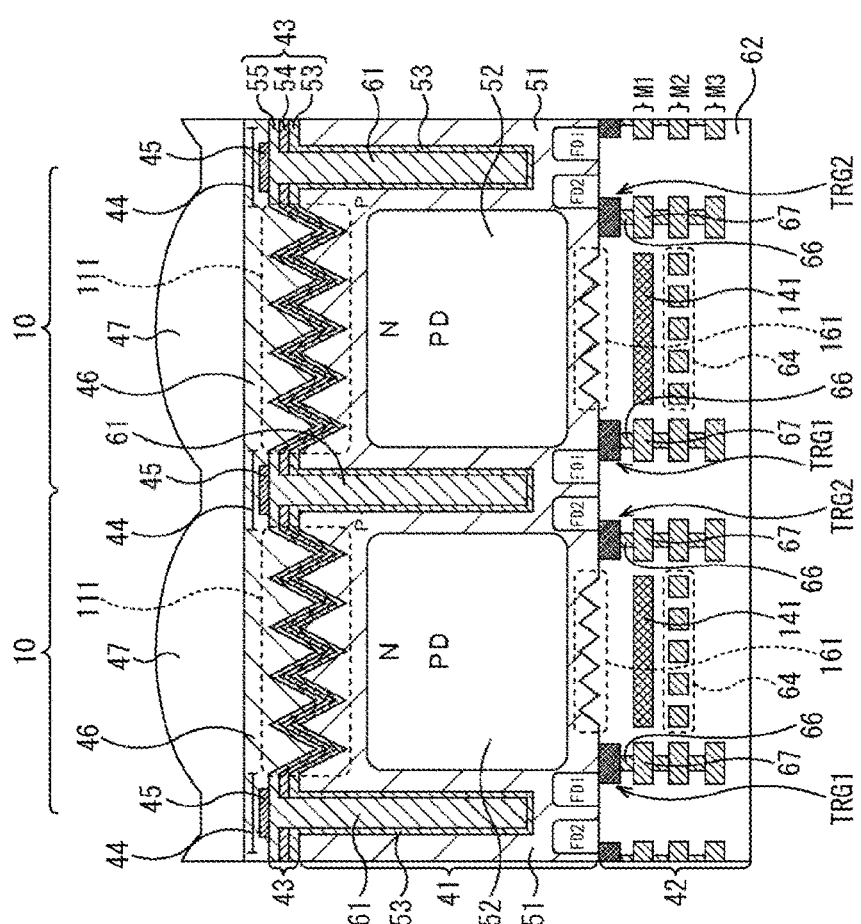
FIG. 20 is a cross-sectional view illustrating a sixth configuration example of pixels.

FIG. 20 is a cross-sectional view illustrating a sixth configuration example of the pixel 10.

In FIG. 20, portions corresponding to those in the first to fifth configuration examples described above are denoted by the same reference numerals and signs, and description of the portions will be appropriately omitted.

The pixel 10 according to the fifth configuration example of FIG. 20 includes the moth eye structure portion 111 on the rear surface of the semiconductor substrate 41 and above the region where the photodiode PD is formed, and includes the moth eye structure portion 161 on the front surface of the semiconductor substrate 41 and below the region where the photodiode PD is formed.

In addition, the pixel 10 according to a sixth configuration example of FIG. 20 includes a reflection film 141 which is formed of a material having a reflectance lower than those of the materials of the other metal wirings 67 of the first metal film M1 in the layer of the first metal film M1 below the region where the photodiode PD is formed.

In other words, the pixel 10 according to the sixth configuration example of FIG. 20 has a structure in which the moth eye structure portion 111 is added to the rear surface side of the semiconductor substrate 41 according to the fourth configuration example illustrated in FIG. 18.

In the sixth configuration example of FIG. 20, the shape of a fine concave-convex structure of the moth eye structure portion 111 on the rear surface side (upper side in the drawing) of the semiconductor substrate 41 and the shape of a fine concave-convex structure of the moth eye structure portion 161 on the front surface side (lower side in the drawing) of the semiconductor substrate 41 may be the same or different. In addition, the cycle of the concave-convex structure of the moth eye structure portion 111 and the cycle of the concave-convex structure of the moth eye structure portion 161 may be the same or different.

For example, in a case where the cycle of the concave-convex structure of the moth eye structure portion 111 is set to be longer than the cycle of the concave-convex structure of the moth eye structure portion 161, light having a wavelength close to infrared rays is diffused by the moth eye structure portion 111, light having a wavelength close to ultraviolet rays is diffused by the moth eye structure portion 161, and light having a wavelength close to infrared rays is not diffused by the moth eye structure portion 161. In a case where the semiconductor substrate 41 has a large thickness and it is not necessary to relatively suppress reflection of infrared rays, the cycle of the concave-convex structure of the moth eye structure portion 111 is set to be longer than the cycle of the concave-convex structure of the moth eye structure portion 161. In contrast, in a case where the semiconductor substrate 41 has a small thickness and the reflection of infrared rays in the reflection film 141 is desired to be suppressed, the cycle of the concave-convex structure of the moth eye structure portion 161 is set to be longer than the cycle of the concave-convex structure of the moth eye structure portion 111.

Also in the sixth configuration example of FIG. 20, it is possible to prevent leakage of incident light to an adjacent pixel due to wraparound from the on-chip lens 47 side by the reflection film 141 having a reflectance lower than those of the other metal wirings 67. In addition, it is possible to prevent light reflected by the reflection film 141 from further penetrating the light incident surface of the semiconductor substrate 41 by the moth eye structure portions 111 and 161.

14. CROSS-SECTIONAL VIEW ACCORDING TO SEVENTH CONFIGURATION EXAMPLE OF PIXEL

Figure 21:
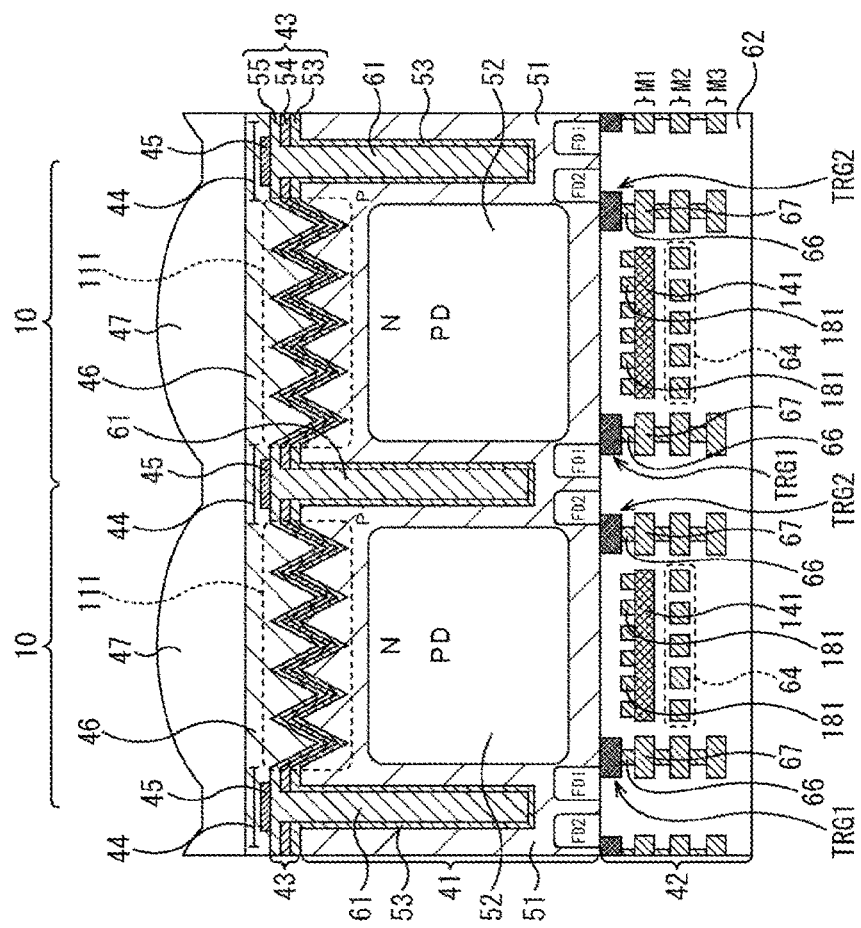
FIG. 21 is a cross-sectional view illustrating a seventh configuration example of pixels.

FIG. 21 is a cross-sectional view illustrating a seventh configuration example of the pixel 10.

In FIG. 21, portions corresponding to those in the first to sixth configuration examples described above are denoted by the same reference numerals and signs, and description of the portions will be appropriately omitted.

The pixel 10 according to the sixth configuration example of FIG. 21 includes the moth eye structure portion 111 on the rear surface of the semiconductor substrate 41.

In addition, the pixel 10 according to the sixth configuration example of FIG. 20 includes the reflection film 141 formed of a material having a reflectance lower than those of the materials of the other metal wirings 67 of the first metal film M1 in the layer of the first metal film M1 below the region where the photodiode PD is formed.

In addition, a plurality of dummy contacts 181 are formed on the surface of the reflection film 141 on the semiconductor substrate 41 side. The dummy contacts 181 are formed of the same material and in the same step as those of the gate contact 66 connected to the gate of the transfer transistor TRG1 or TRG2, but are contact wirings that are not connected to a gate of a pixel transistor. A fine concave-convex structure is formed by forming the plurality of dummy contacts 181 on the surface of the reflection film 141 on the semiconductor substrate 41 side, and thus the same effects as those of the reflection film 141M in the fifth configuration example illustrated in FIG. 19 can be obtained.

That is, light having penetrated the photodiode PD is diffused by the plurality of dummy contacts 181 and is reflected toward the semiconductor substrate 41 by the plurality of dummy contacts 181 formed on the surface of the reflection film 141M on the semiconductor substrate 41 side. Thereby, it is possible to prevent light reflected by the reflection film 141 from further penetrating the light incident surface of the semiconductor substrate 41. As a result, it is possible to prevent leakage of incident light to an adjacent pixel due to wraparound from the on-chip lens 47 side.

Also in the seventh configuration example of FIG. 21, it is possible to prevent leakage of incident light to an adjacent pixel due to wraparound from the on-chip lens 47 side by the reflection film 141 having a reflectance lower than those of the other metal wirings 67. In addition, it is possible to prevent light reflected by the reflection film 141 from further penetrating the light incident surface of the semiconductor substrate 41 by the moth eye structure portion 111.

Modification Example of Seventh Configuration Example

Note that the planar shape and size of the dummy contact 181, the number of dummy contacts 181 disposed on the plane of the reflection film 141, and the like are not particularly limited and can be determined arbitrarily. The size and shape of the dummy contact 181 may be the same as or different from the size and shape of the gate contact 66 connected to the gate of the transfer transistor TRG1 or TRG2.

Figure 22:
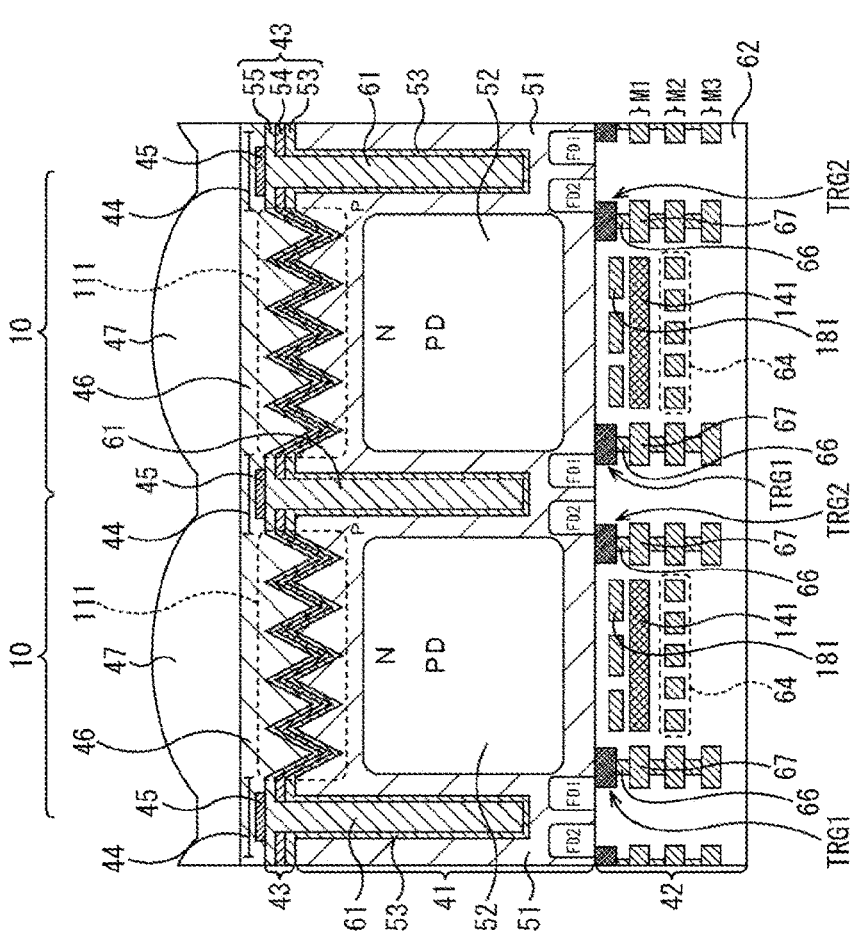
FIG. 22 is a cross-sectional view illustrating a modification example of the seventh configuration example of pixels.

For example, as illustrated in FIG. 22, the dummy contact 181 is formed to have a planar size larger than that of the gate contact 66, and may be formed slightly above (photodiode PD side) the reflection film 141 with the insulating interlayer film 62 interposed therebetween without being connected to the reflection film 141.

15. CROSS-SECTIONAL VIEW ACCORDING TO EIGHTH CONFIGURATION EXAMPLE OF PIXEL

Figure 23:
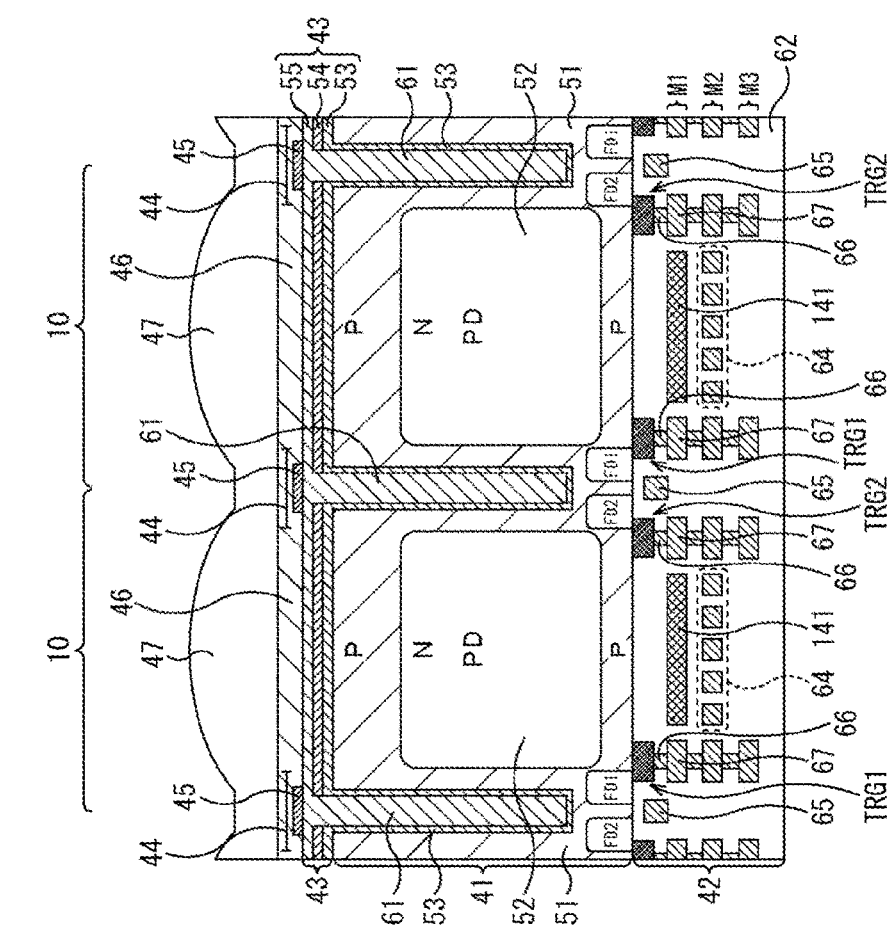
FIG. 23 is a cross-sectional view illustrating an eighth configuration example of pixels.

FIG. 23 is a cross-sectional view illustrating an eighth configuration example of the pixel 10.

In FIG. 23, portions corresponding to those in the first to seventh configuration examples described above are denoted by the same reference numerals and signs, and description of the portions will be appropriately omitted.

In the above-described first to seventh configuration examples and the modification examples thereof, various configurations in which leakage of incident light to an adjacent pixel due to wraparound from the multi-layered wiring layer 42 is prevented and various configurations in which leakage of incident light to an adjacent pixel due to wraparound from the on-chip lens 47 side is prevented have been described. By appropriately combining these various configurations, it is possible to adopt a configuration in which leakage of incident light to an adjacent pixel due to wraparound from the multi-layered wiring layer 42 and due to wraparound from the on-chip lens 47 side is prevented.

For example, the pixel 10 according to the eighth configuration example illustrated in FIG. 23 has characteristic configurations of both the first configuration example illustrated in FIG. 2 and the third configuration example illustrated in FIG. 13.

That is, the pixel 10 illustrated in FIG. 23 includes a reflection film 141 formed of a material having a reflectance lower than those of the materials of the other metal wirings 67 of the first metal film M1 in the layer of the first metal film M1 below the region where the photodiode PD is formed.

In addition, the pixel 10 illustrated in FIG. 23 includes an inter-pixel light shielding unit 65 that prevents incident light, which is reflected by the reflection film 141, from being incident on the photodiode PD of the next pixel 10 at the pixel boundary portion 44 of the multi-layered wiring layer 42.

Other configurations of the eighth configuration example of FIG. 23, for example, are the same as those of the first configuration example illustrated in FIG. 2.

According to the pixel 10 illustrated in FIG. 23 which has the above-described configuration, leakage of incident light to an adjacent pixel due to wraparound from the multi-layered wiring layer 42 is prevented by the inter-pixel light shielding unit 65 disposed at the pixel boundary portion 44 of the multi-layered wiring layer 42.

In addition, it is possible to prevent leakage of incident light to an adjacent pixel due to wraparound from the on-chip lens 47 side by the reflection film 141 disposed below the region where the photodiode PD is formed in the multi-layered wiring layer 42.

Figure 24:
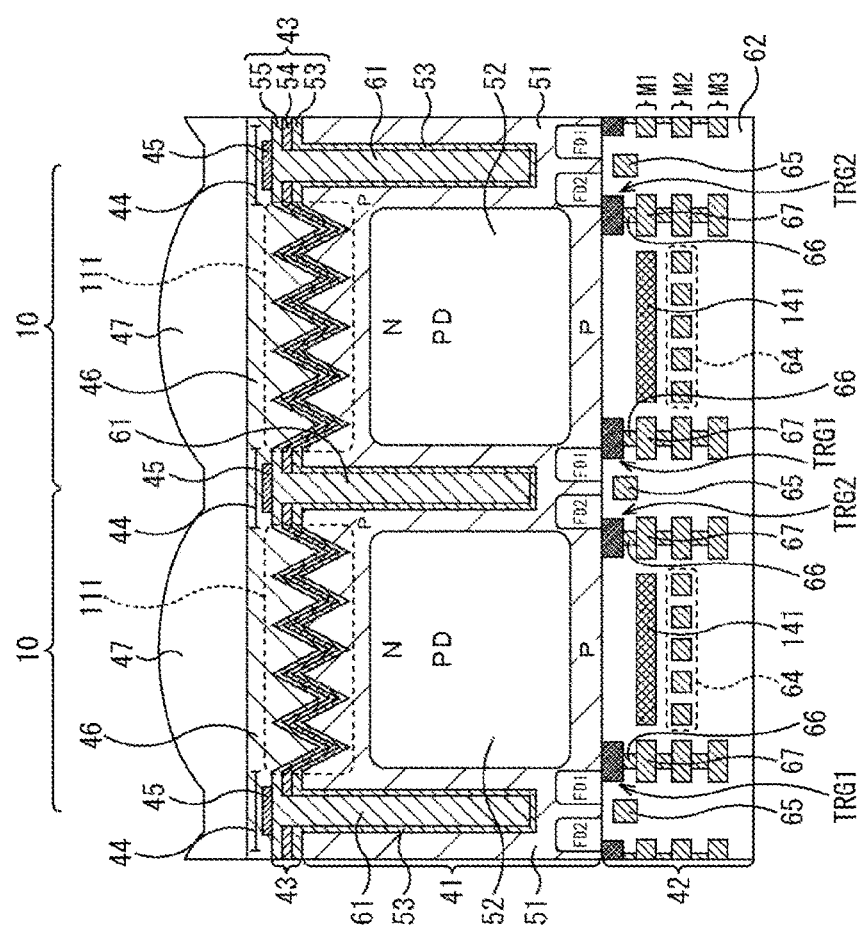
FIG. 24 is a cross-sectional view illustrating a modification example of the eighth configuration example of pixels.

Further, for example, a pixel 10 illustrated in FIG. 24 has a structure in which the moth eye structure portion 111 is further added to the rear surface of the semiconductor substrate 41, in addition to the inter-pixel light shielding unit 65 and the reflection film 141 illustrated in FIG. 23. It is possible to further suppress reflection at an interface of the substrate by the moth eye structure portion 111.

Although not illustrated in the drawing, by appropriately combining various configurations in which leakage of incident light to an adjacent pixel due to wraparound from the multi-layered wiring layer 42 is prevented (the above-described first and second configuration examples) and various configurations in which leakage of incident light to an adjacent pixel due to wraparound from the on-chip lens 47 side is prevented (the above-described third to seventh configuration examples), it is possible to simultaneously achieve the prevention of leakage of incident light to an adjacent pixel due to wraparound from the multi-layered wiring layer 42 and the prevention of leakage of incident light to an adjacent pixel due to wraparound from the on-chip lens 47 side.

16. CROSS-SECTIONAL VIEW ACCORDING TO NINTH CONFIGURATION EXAMPLE OF PIXEL

Figure 25:
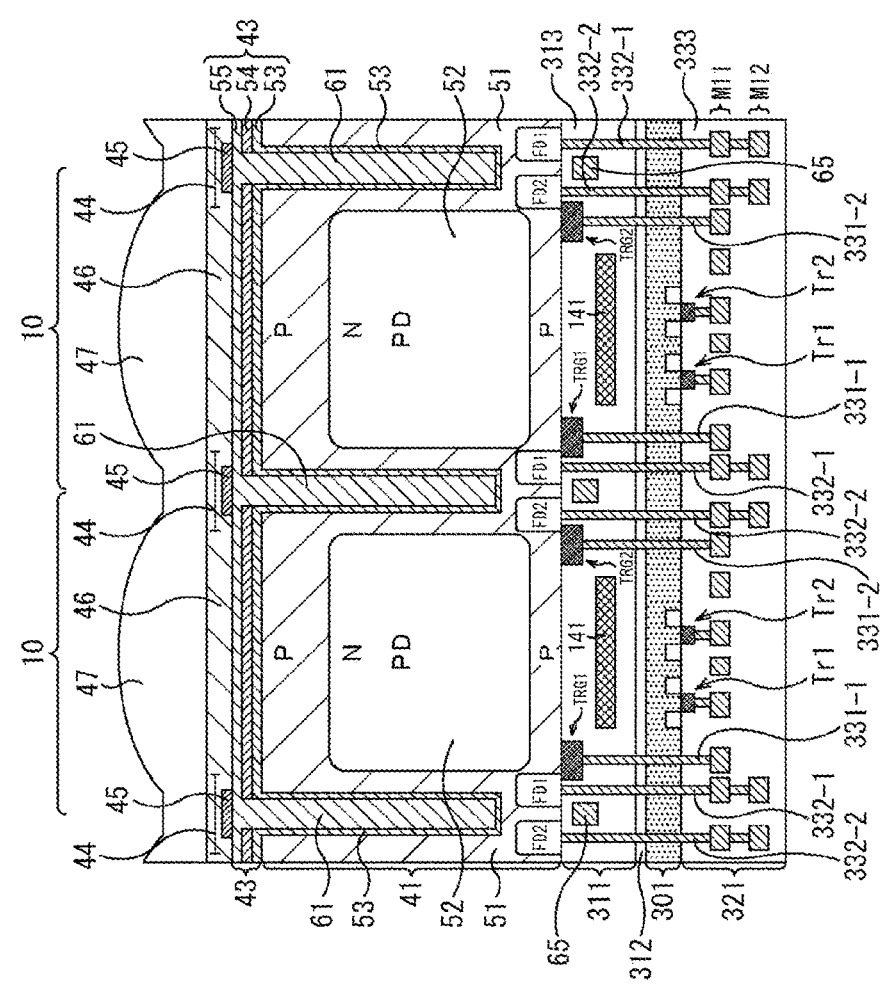
FIG. 25 is a cross-sectional view illustrating a ninth configuration example of pixels.

FIG. 25 is a cross-sectional view illustrating a ninth configuration example of the pixel 10.

In FIG. 25, portions corresponding to those in the above-described first to eighth configuration examples are denoted by the same reference numerals and signs, and description of the portions will be appropriately omitted.

In the above-described first to eighth configuration examples, the light receiving element 1 is configured using one semiconductor substrate, that is, only the semiconductor substrate 41, but in the ninth configuration example of FIG. 25, the light receiving element 1 is configured using two semiconductor substrates, that is, the semiconductor substrate 41 and the semiconductor substrate 301.

The pixel 10 according to the ninth configuration example of FIG. 25 is configured such that the eighth configuration example of FIG. 23 using one semiconductor substrate 41 is changed to a configuration using two semiconductor substrates, that is, the semiconductor substrate 41 and the semiconductor substrate 301. Hereinafter, in order to facilitate the understanding, description will be given by also referring the semiconductor substrate 41 and the semiconductor substrate 301 to as a first substrate 41 and a second substrate 301, respectively.

The ninth configuration example of FIG. 25 is the same as the first configuration example of FIG. 2 in that the inter-pixel light shielding film 45, the flattening film 46, and the on-chip lens 47 are formed on the light incident surface side of the first substrate 41. The ninth configuration example is also the same as the first configuration example of FIG. 2 in that the inter-pixel separation portion 61 is formed at the pixel boundary portion 44 on the rear surface side of the first substrate 41.

In addition, the ninth configuration example is also the same as the first configuration example of FIG. 2 in that the photodiodes PD which are photoelectric conversion units are formed on the first substrate 41 in units of pixels and in that two transfer transistors TRG1 and TRG2 and the floating diffusion regions FD1 and FD2 as charge accumulation portions are formed on the front surface side of the first substrate 41.

On the other hand, as a difference from the first configuration example of FIG. 2, an insulating layer 313 of a wiring layer 311 which is the surface side of the first substrate 41 is bonded to an insulating layer 312 of the second substrate 301.

The wiring layer 311 of the first substrate 41 includes at least a metal film M of a single layer, and the reflection film 141 is formed in a region positioned below the region where the photodiode PD is formed, using the metal film M. In addition, the inter-pixel light shielding unit 65 is formed at the pixel boundary portion 44 of the wiring layer 311.

Pixel transistors Tr1 and Tr2 are formed at an interface on a side opposite to the insulating layer 312 side which is a bonding surface side of the second substrate 301. The pixel transistors Tr1 and Tr2 are, for example, the amplification transistor AMP and the selection transistor SEL.

That is, in the first to eighth configuration examples configured using only one semiconductor substrate 41 (first substrate 41), all pixel transistors of the transfer transistor TRG, the switching transistor FDG, the amplification transistor AMP, and the selection transistor SEL are formed on the semiconductor substrate 41. However, in the light receiving element 1 according to the ninth configuration example which is constituted by a laminated structure of two semiconductor substrates, pixel transistors other than the transfer transistor TRG, that is, the switching transistor FDG, the amplification transistor AMP, and the selection transistor SEL are formed on the second substrate 301.

A multi-layered wiring layer 321 including at least metal films M of two layers is formed on a side opposite to the first substrate 41 side of the second substrate 301. The multi-layered wiring layer 321 includes a first metal film M11, a second metal film M12, and an insulating interlayer film 333.

A transfer drive signal TRG1$g$ that controls the transfer transistor TRG1 is supplied from the first metal film M11 of the second substrate 301 to a gate electrode of the transfer transistor TRG1 of the first substrate 41 by a through silicon via (TSV) 331-1 that penetrates the second substrate 301. A transfer drive signal TRG2$g$ that controls the transfer transistor TRG2 is supplied from the first metal film M11 of the second substrate 301 to a gate electrode of the transfer transistor TRG2 of the first substrate 41 by a TSV 331-2 that penetrates the second substrate 301.

Similarly, charge accumulated in the floating diffusion region FD1 is also transferred from the first substrate 41 side to the first metal film M11 of the second substrate 301 by a TSV 332-1 that penetrates the second substrate 301. Charge accumulated in the floating diffusion region FD2 is transferred from the first substrate 41 side to the first metal film M11 of the second substrate 301 by a TSV 332-2 that penetrates the second substrate 301.

The wiring capacitance 64 is formed in a region, which is not illustrated in the drawing, of the first metal film M11 or the second metal film M12. The metal film M having the wiring capacitance 64 formed therein is formed to have a high wiring density in order to form a capacity, and the metal film M connected to a gate electrode of the transfer transistor TRG, the switching transistor FDG, or the like is formed to have a low wiring density in order to reduce an induced current. A configuration in which a wiring layer (metal film M) connected to the gate electrode is different for each pixel transistor may be adopted.

As described above, the pixel 10 according to the ninth configuration example can be configured such that two semiconductor substrates, that is, the first substrate 41 and the second substrate 301 are laminated, and the pixel transistors other than the transfer transistor TRG are formed on the second substrate 301 different from the first substrate 41 including a photoelectric conversion unit. In addition, the vertical drive unit 22 and the pixel drive line 28 that control the driving of the pixels 10, the vertical signal line 29 for transmitting a detection signal, and the like are also formed on the second substrate 301. Thereby, the pixel can be made fine, and the degree of freedom in back end of line (BEOL) design is also increased.

Also in the ninth configuration example, the reflection film 141 is formed in a region of the wiring layer 311 which is positioned below the region where the photodiode PD is formed, and the inter-pixel light shielding unit 65 is formed at the pixel boundary portion 44 of the wiring layer 311. Thereby, it is possible to simultaneously achieve the prevention of leakage of incident light to an adjacent pixel due to wraparound from the multi-layered wiring layer 42 and the prevention of leakage of incident light to an adjacent pixel due to wraparound from the on-chip lens 47 side.

The ninth configuration example of FIG. 25 is configured such that the eighth configuration example of FIG. 23 is changed to a laminated structure in which two semiconductor substrates are laminated. However, similarly, the above-described first to seventh configuration examples can be changed to a laminated structure in which two semiconductor substrates are laminated.

17. CONFIGURATION EXAMPLE OF IR IMAGING SENSOR

The above-described pixel structure including at least one of the inter-pixel light shielding unit 65 and the reflection film 141 is not limited to a light receiving element that outputs distance measurement information according to an indirect ToF scheme, and can also be applied to an IR imaging sensor that receives infrared rays and generates an IR image.

Figure 26:
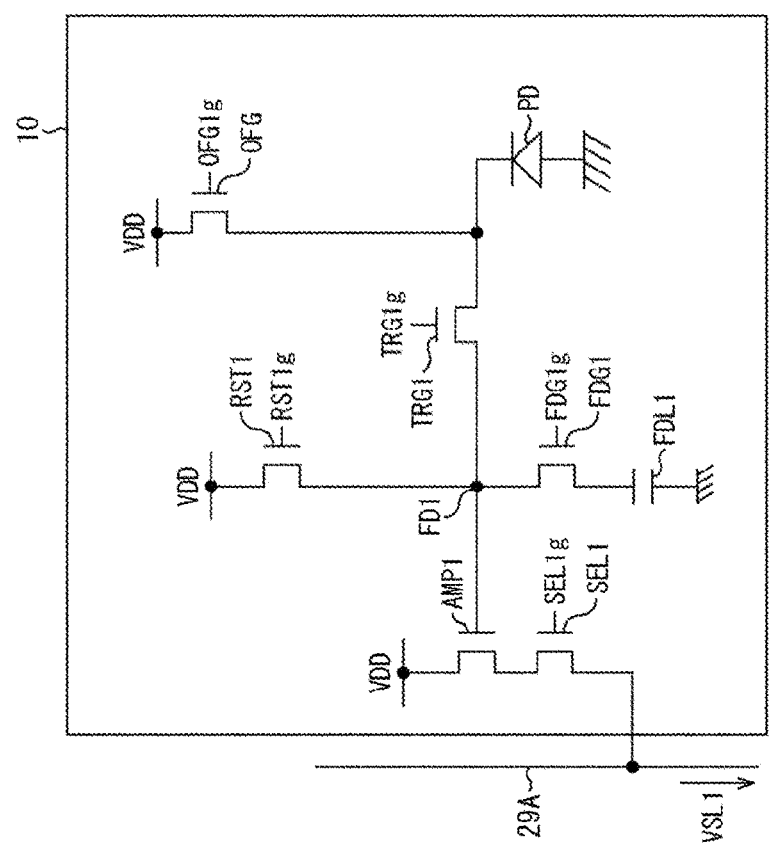
FIG. 26 is a diagram illustrating a circuit configuration example of pixels in a case where the light receiving element is configured as an IR imaging sensor.

FIG. 26 illustrates a circuit configuration of the pixel 10 in a case where the light receiving element 1 is configured as an IR imaging sensor that generates and outputs an IR image.

In a case where the light receiving element 1 is a ToF sensor, the light receiving element 1 distributes charge generated by the photodiode PD into two floating diffusion regions FD1 and FD2 and accumulates the charge, and thus the pixel 10 includes two transfer transistors TRG, two floating diffusion regions FD, two additional capacitors FDL, two switching transistors FDG, two amplification transistors AMP, two reset transistors RST, and two selection transistors SEL.

In a case where the light receiving element 1 is an IR imaging sensor, the number of charge accumulation portions in which charge generated by the photodiode PD is temporarily held may be one, and thus the number of transfer transistors TRG, the number of floating diffusion regions FD, the number of additional capacitors FDL, the number of switching transistors FDG, the number of amplification transistors AMP, the number of reset transistors RST, and the number of selection transistors SEL are also set to be one.

In other words, in a case where the light receiving element 1 is an IR imaging sensor, the pixel 10 is equivalent to a configuration in which the transfer transistor TRG2, the switching transistor FDG2, the reset transistor RST2, the amplification transistor AMP2, and the selection transistor SEL2 are omitted from the circuit configuration illustrated in FIG. 4 as illustrated in FIG. 26. The floating diffusion region FD2 and the vertical signal line 29B are also omitted.

Figure 27:
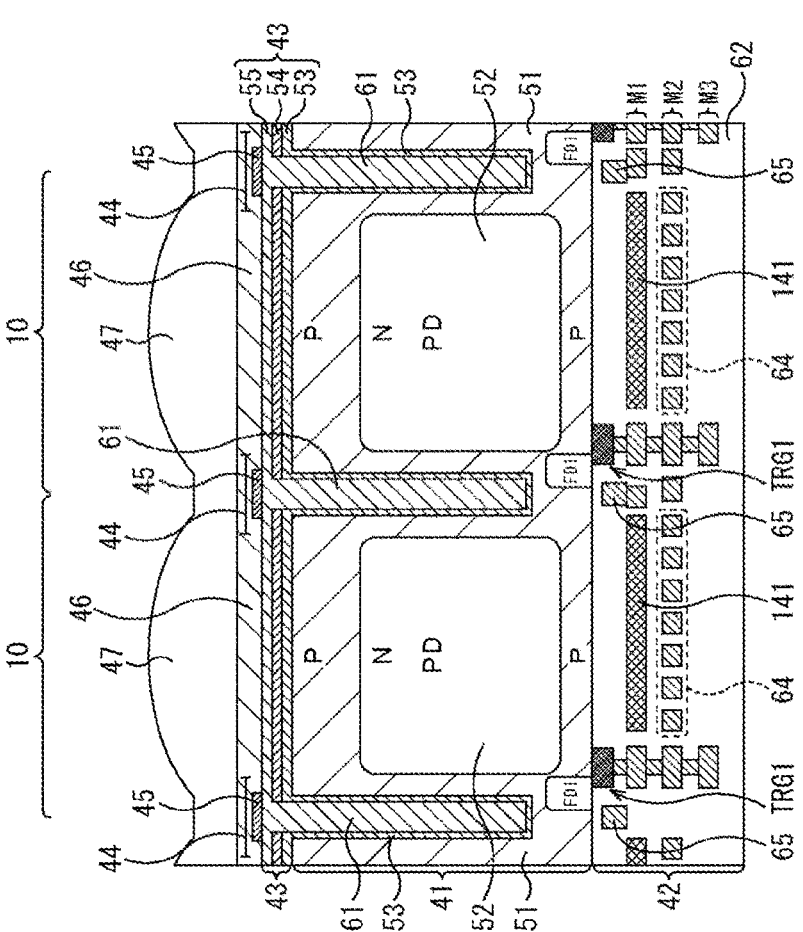
FIG. 27 is a cross-sectional view of pixels in a case where the light receiving element is configured as an IR imaging sensor.

FIG. 27 is a cross-sectional view of the pixel 10 in a case where the light receiving element 1 is configured as an IR imaging sensor.

FIG. 27 illustrates a cross-sectional configuration in a case where the eighth configuration example illustrated in FIG. 23 is applied to an IR imaging sensor.

A difference between a case where the light receiving element 1 is configured as an IR imaging sensor and a case where the light receiving element 1 is configured as a ToF sensor is whether the floating diffusion region FD2 formed on the front surface side of the semiconductor substrate 41 and a pixel transistor are present or not, as described in FIG. 26. For this reason, a configuration of the multi-layered wiring layer 42 which is the front surface side of the semiconductor substrate 41 is different from that in FIG. 23. Specifically, as compared with FIG. 23, the floating diffusion region FD2 and the transfer transistor TRG2 are omitted in the pixel 10 illustrated in FIG. 27.

On the other hand, as a configuration which is common to FIG. 23, in the pixel 10 illustrated in FIG. 27, the reflection film 141 is formed using a material having a reflectance lower than those of the materials of the other metal wirings 67 of the first metal film M1 in the layer of the first metal film M1 of the multi-layered wiring layer 42 below the region where the photodiode PD is formed. In addition, the inter-pixel light shielding unit 65 is formed at the pixel boundary portion 44 of the multi-layered wiring layer 42.

FIG. 27 illustrates a cross-sectional configuration in a case where the eighth configuration example illustrated in FIG. 23 is applied to an IR imaging sensor. However, similarly, the above-described first to seventh configuration examples can be applied to an IR imaging sensor by omitting the floating diffusion region FD2 formed on the front surface side of the semiconductor substrate 41 and a pixel transistor corresponding thereto.

Also in a case where the light receiving element 1 is configured as an IR imaging sensor, it is possible to prevent leakage of incident light to an adjacent pixel due to wraparound from the multi-layered wiring layer 42 by providing the inter-pixel light shielding unit 65 at the pixel boundary portion 44 of the multi-layered wiring layer 42. Further, it is possible to prevent leakage of incident light to an adjacent pixel due to wraparound from the on-chip lens 47 side by providing the reflection film 141.

Thus, also in a case where the light receiving element 1 is configured as an IR imaging sensor, it is possible to further increase the amount of infrared rays being subjected to photoelectric conversion in the semiconductor substrate 41 to improve quantum efficiency, that is, sensitivity for infrared rays.

18. CONFIGURATION EXAMPLE OF RGBIR IMAGING SENSOR

The above-described pixel structure including at least one of the inter-pixel light shielding unit 65 and the reflection film 141 is not limited to a light receiving element that receives only infrared rays, and can also be applied to an RGBIR imaging sensor that receives infrared rays and RGB rays.

Figure 28:
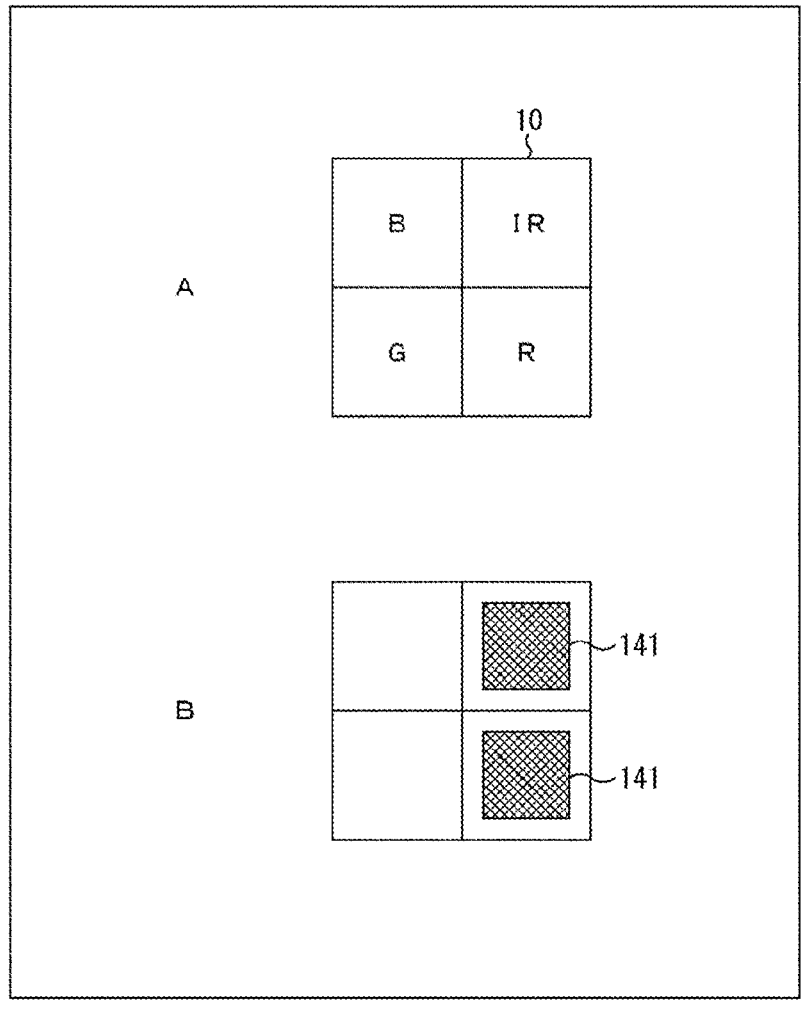
FIG. 28 is a diagram illustrating an example of arrangement of pixels in a case where the light receiving element is configured as an RGBIR imaging sensor.

FIG. 28 illustrates an example of arrangement of pixels in a case where the light receiving element 1 is configured as an RGBIR imaging sensor that receives infrared rays and RGB lays.

In a case where the light receiving element 1 is configured as an RGBIR imaging sensor, an R pixel that receives light of R (red), a B pixel that receives light of B (blue), a G pixel that receives light of G (green), and an IR pixel that receives light of IR (infrared) are allocated to 4 pixels of 2×2, as illustrated in A of FIG. 28.

The reflection film 63 or 141 reflecting infrared rays which have passed through the semiconductor substrate 41 without being subjected to photoelectric conversion in the semiconductor substrate 41 and making the infrared rays incident into the semiconductor substrate 41 again may be disposed in all of the R pixel, the B pixel, the G pixel, and the IR pixel, or may be disposed in only some of the pixels for the purpose of adjusting the amount of received light (light receiving sensitivity), and the like.

For example, as illustrated in B of FIG. 28, a configuration in which the reflection film 63 or 141 is disposed in the IR pixel and the R pixel and is not disposed in the B pixel and the G pixel among the R pixel, the B pixel, the G pixel, and the IR pixel can be adopted.

19. CONFIGURATION EXAMPLE OF DISTANCE MEASUREMENT MODULE

Figure 29:
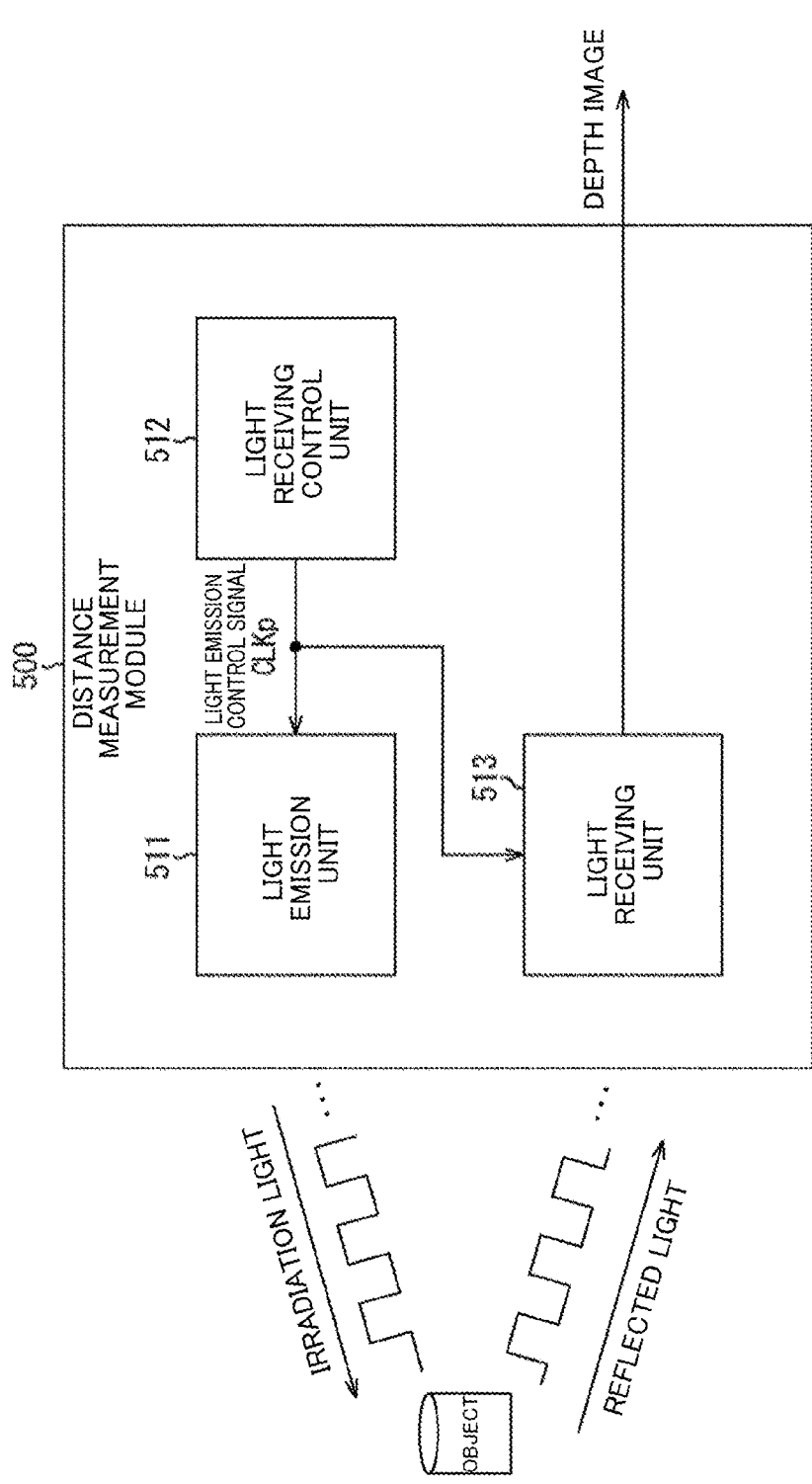
FIG. 29 is a block diagram illustrating a configuration example of a distance measurement module to which the present technology is applied.

FIG. 29 is a block diagram illustrating a configuration example of a distance measurement module that outputs distance measurement information using the above-described light receiving element 1.

A distance measurement module 500 includes a light emission unit 511, a light emission control unit 512, and a light receiving unit 513.

The light emission unit 511 includes a light source that emits light having a predetermined wavelength, and irradiates an object with irradiation light of which the brightness varies periodically. For example, the light emission unit 511 includes a light emitting diode that emits infrared rays having a wavelength in a range of 780 nm to 1000 nm as a light source, and generates irradiation light in synchronization with a light emission control signal CLKp of a rectangular wave supplied from the light emission control unit 512.

Note that the light emission control signal CLKp is not limited to a rectangular wave as long as it is a period signal. For example, the light emission control signal CLKp may be a sine wave.

The light emission control unit 512 supplies the light emission control signal CLKp to the light emission unit 511 and the light receiving unit 513 and controls a radiation timing of radiation light. The frequency of the light emission control signal CLKp is, for example, 20 megahertz (MHz). Note that the frequency of the light emission control signal CLKp is not limited to 20 megahertz and may be 5 megahertz, 100 megahertz, or the like.

The light receiving unit 513 receives reflected light reflected from an object, calculates distance information for each pixel in accordance with a result of light reception, and generates and outputs a depth image in which a depth value corresponding to a distance to the object (subject) is stored as a pixel value.

The light receiving element 1 having the pixel structure of any one of the above-described first to eighth configuration examples is used in the light receiving unit 513. For example, the light receiving element 1 as the light receiving unit 513 calculates distance information for each pixel from a detection signal corresponding to charge distributed to the floating diffusion regions FD1 or FD2 of the pixels 10 of the pixel array portion 21 on the basis of the light emission control signal CLKp.

As described above, as the light receiving unit 513 of the distance measurement module 500 that obtains and outputs information on a distance to a subject by an indirect ToF scheme, the light receiving element 1 having the pixel structure of any one of the above-described first to eighth configuration examples can be incorporated. Thereby, it is possible to improve distance measurement characteristics as the distance measurement module 500.

20. CONFIGURATION EXAMPLE OF ELECTRONIC EQUIPMENT

Note that, as described above, the light receiving element 1 can be applied to a distance measurement module, and can also be applied to various electronic equipment such as, for example, imaging devices such as digital still cameras and digital video cameras equipped with a distance measurement function, and smartphones equipped with a distance measurement function.

Figure 30:
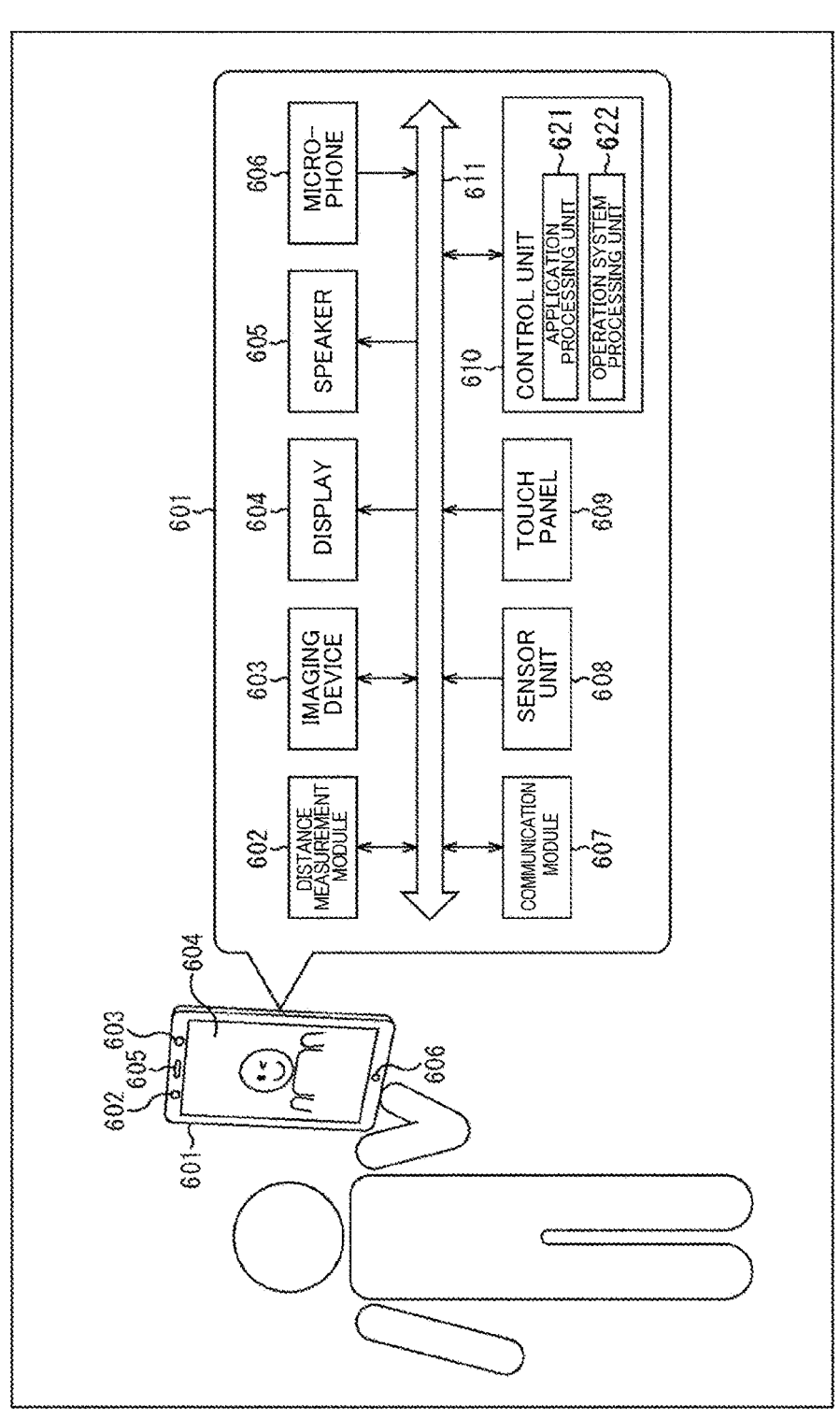
FIG. 30 is a block diagram illustrating a configuration example of a smartphone as electronic equipment to which the present technology is applied.

FIG. 30 is a block diagram illustrating a configuration example of a smartphone as electronic equipment to which the present technology is applied.

As illustrated in FIG. 30, a smartphone 601 is configured such that a distance measurement module 602, an imaging device 603, a display 604, a speaker 605, a microphone 606, a communication module 607, a sensor unit 608, a touch panel 609, and a control unit 610 are connected to each other via a bus 611. Further, the control unit 610 has functions as an application processing unit 621 and an operation system processing unit 622 by causing a CPU to execute a program.

The distance measurement module 500 illustrated in FIG. 29 is applied to the distance measurement module 602. For example, the distance measurement module 602 is disposed on the front surface of the smartphone 601, and can output a depth value of a surface shape of the face, hand, finger, or the like of a user of the smartphone 601 as a distance measurement result by performing distance measurement on the user.

The imaging device 603 is disposed on the front surface of the smartphone 601, and acquires an image captured by the user of the smartphone 601 by imaging the user as a subject. Note that, although not illustrated in the drawing, a configuration in which the imaging device 603 is also disposed on the back surface of the smartphone 601 may be adopted.

The display 604 displays an operation screen for performing processing by the application processing unit 621 and the operation system processing unit 622, an image captured by the imaging device 603, and the like. The speaker 605 and the microphone 606 perform, for example, outputting of a voice of the other party and collecting of a user's voice when making a call using the smartphone 601.

The communication module 607 performs network communication through a communication network such as the Internet, a public telephone network, a wide area communication network for wireless mobiles such as a so-called 4G line and 5G line, a wide area network (WAN), and a local area network (LAN), short-range wireless communication such as Bluetooth (registered trademark) and near field communication (NFC), and the like. The sensor unit 608 senses speed, acceleration, proximity, and the like, and the touch panel 609 acquires a user's touch operation on the operation screen displayed on the display 604.

The application processing unit 621 performs processing for providing various services by the smartphone 601. For example, the application processing unit 621 can create a face by computer graphics that virtually reproduces the user's facial expression on the basis of a depth value supplied from the distance measurement module 602, and can perform processing for displaying the face on the display 604. In addition, the application processing unit 621 can perform processing of creating, for example, three-dimensional shape data of an arbitrary three-dimensional object on the basis of a depth value supplied from the distance measurement module 602.

The operation system processing unit 622 performs processing for realizing basic functions and operations of the smartphone 601. For example, the operation system processing unit 622 can perform processing for authenticating a user's face on the basis of a depth value supplied from the distance measurement module 602, and unlocking the smartphone 601. In addition, the operation system processing unit 622 can perform, for example, processing for recognizing a user's gesture on the basis of a depth value supplied from the distance measurement module 602, and can perform processing for inputting various operations according to the gesture.

In the smartphone 601 configured in this manner, the above-described distance measurement module 500 is applied as the distance measurement module 602, and thus it is possible to perform, for example, processing for measuring and displaying a distance to a predetermined object or creating and displaying three-dimensional shape data of a predetermined object, and the like.

21. EXAMPLE OF APPLICATION TO MOVING BODY

The technology according to the present disclosure (the present technology) can be applied to various products. For example, the technology according to the present disclosure may be realized as a device mounted on any type of moving body such as an automobile, an electric vehicle, a hybrid electric vehicle, a motorcycle, a bicycle, a personal mobility, an airplane, a drone, a ship, and a robot.

Figure 31:
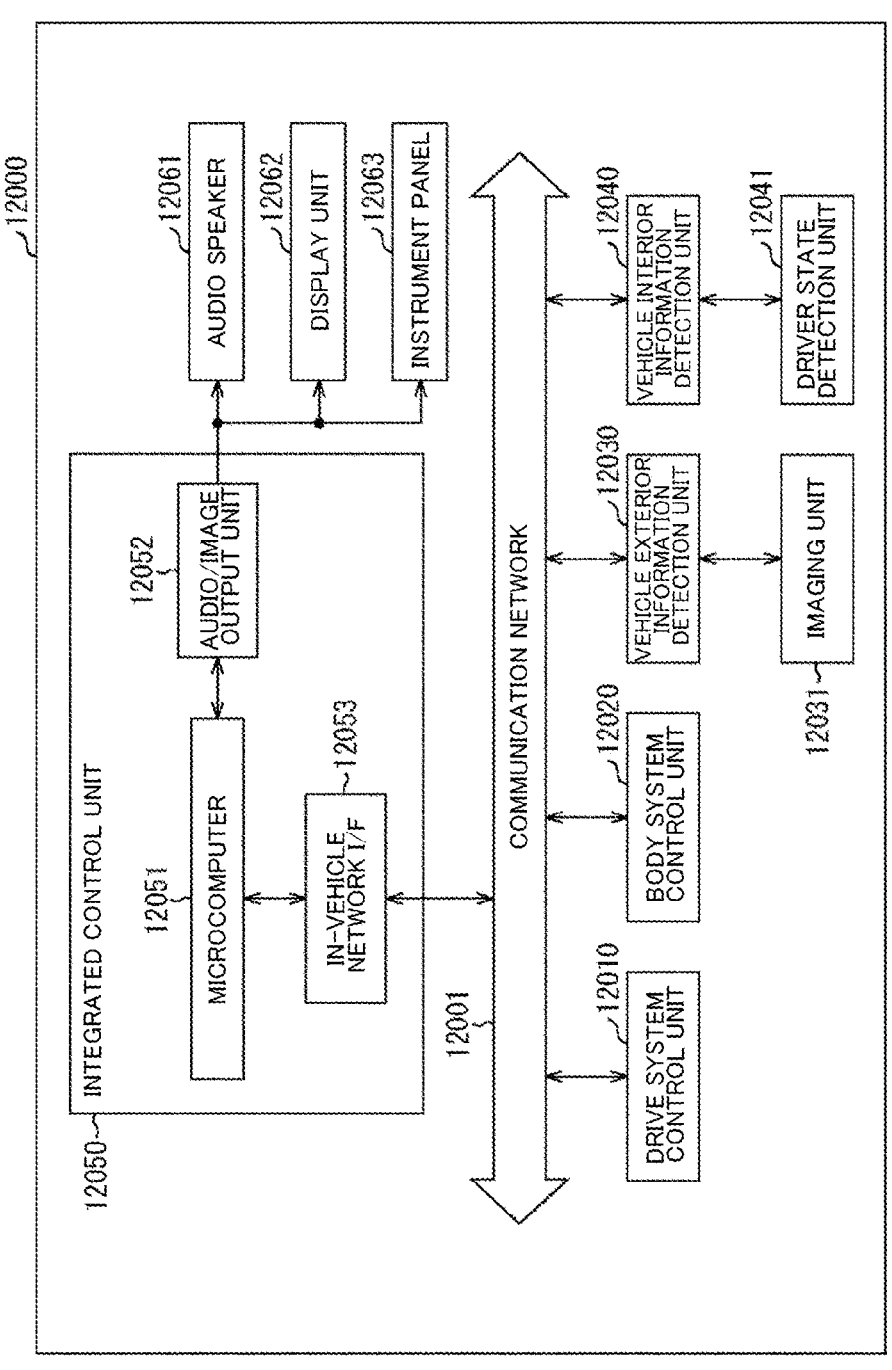
FIG. 31 is a block diagram illustrating an example of a schematic configuration of a vehicle control system.

FIG. 31 is a block diagram illustrating a schematic configuration example of a vehicle control system which is an example of a moving body control system to which the technology according to the present disclosure can be applied.

A vehicle control system 12000 includes a plurality of electronic control units connected via a communication network 12001. In the example illustrated in FIG. 31, the vehicle control system 12000 includes a drive system control unit 12010, a body system control unit 12020, a vehicle exterior information detection unit 12030, a vehicle interior information detection unit 12040, and an integrated control unit 12050. Further, a microcomputer 12051, an audio/image output unit 12052, and an in-vehicle network interface (I/F) 12053 are illustrated as a functional configuration of the integrated control unit 12050.

The drive system control unit 12010 controls operations of devices related to a drive system of a vehicle according to various programs. For example, the drive system control unit 12010 functions as a driving force generator for generating a driving force of a vehicle such as an internal combustion engine or a driving motor, a driving force transmission mechanism for transmitting a driving force to wheels, a steering mechanism for adjusting a turning angle of a vehicle, and a control device such as a braking device that generates a braking force of a vehicle.

The body system control unit 12020 controls operations of various devices mounted in the vehicle body according to various programs. For example, the body system control unit 12020 functions as a control device of a keyless entry system, a smart key system, a power window device, or various lamps such as a head lamp, a back lamp, a brake lamp, a turn signal, or a fog lamp. In this case, radio waves transmitted from a portable device that substitutes for a key or signals of various switches can be input to the body system control unit 12020. The body system control unit 12020 receives input of these radio waves or signals and controls a door lock device, a power window device, a lamp, and the like of the vehicle.

The vehicle exterior information detection unit 12030 detects information on the outside of the vehicle in which the vehicle control system 12000 is mounted. For example, an imaging unit 12031 is connected to the vehicle exterior information detection unit 12030. The vehicle exterior information detection unit 12030 causes the imaging unit 12031 to capture an image of the exterior of the vehicle and receives the captured image. The vehicle exterior information detection unit 12030 may perform object detection processing or distance detection processing for persons, vehicles, obstacles, signs, or text on a road surface on the basis of the received image.

The imaging unit 12031 is an optical sensor that receives light and outputs an electrical signal corresponding to the amount of the received light. The imaging unit 12031 can also output the electrical signal as an image and distance measurement information. In addition, light received by the imaging unit 12031 may be visible light, or may be invisible light such as infrared light.

The vehicle interior information detection unit 12040 detects information on the interior of the vehicle. For example, a driver state detection unit 12041 that detects a driver's state is connected to the vehicle interior information detection unit 12040. The driver state detection unit 12041 includes, for example, a camera that captures an image of the driver, and the vehicle interior information detection unit 12040 may calculate a degree of fatigue or concentration of the driver or may determine whether or not the driver is dozing on the basis of detection information input from the driver state detection unit 12041.

The microcomputer 12051 can calculate a control target value of the driving force generator, the steering mechanism, or the braking device on the basis of the information on inside and outside the vehicle acquired by the vehicle exterior information detection unit 12030 or the vehicle interior information detection unit 12040, and output a control command to the drive system control unit 12010. For example, the microcomputer 12051 can perform cooperative control aiming at realizing functions of advanced driver assistance system (ADAS) including vehicle collision avoidance or impact mitigation, follow-up traveling based on an inter-vehicle distance, vehicle speed maintenance traveling, vehicle collision warning, vehicle lane deviation warning, and the like.

Further, the microcomputer 12051 can perform coordinated control for the purpose of automated driving or the like in which autonomous travel is performed without depending on an operation of a driver by controlling the driving force generator, the steering mechanism, the braking device, and the like on the basis of information regarding the vicinity of the vehicle acquired by the vehicle exterior information detection unit 12030 or the vehicle interior information detection unit 12040.

Furthermore, the microcomputer 12051 can output a control command to the body system control unit 12020 on the basis of the vehicle exterior information acquired by the vehicle exterior information detection unit 12030. For example, the microcomputer 12051 can perform cooperative control for the purpose of preventing glare, such as switching from a high beam to a low beam, by controlling the headlamp according to the position of a preceding vehicle or an oncoming vehicle detected by the vehicle exterior information detection unit 12030.

The audio/image output unit 12052 transmits an output signal of at least one of audio and an image to an output device capable of visually or audibly notifying an occupant of a vehicle or the outside of the vehicle of information. In the example illustrated in FIG. 31, an audio speaker 12061, a display unit 12062, and an instrument panel 12063 are illustrated as output devices. The display unit 12062 may include, for example, at least one of an on-board display and a heads-up display.

Figure 32:
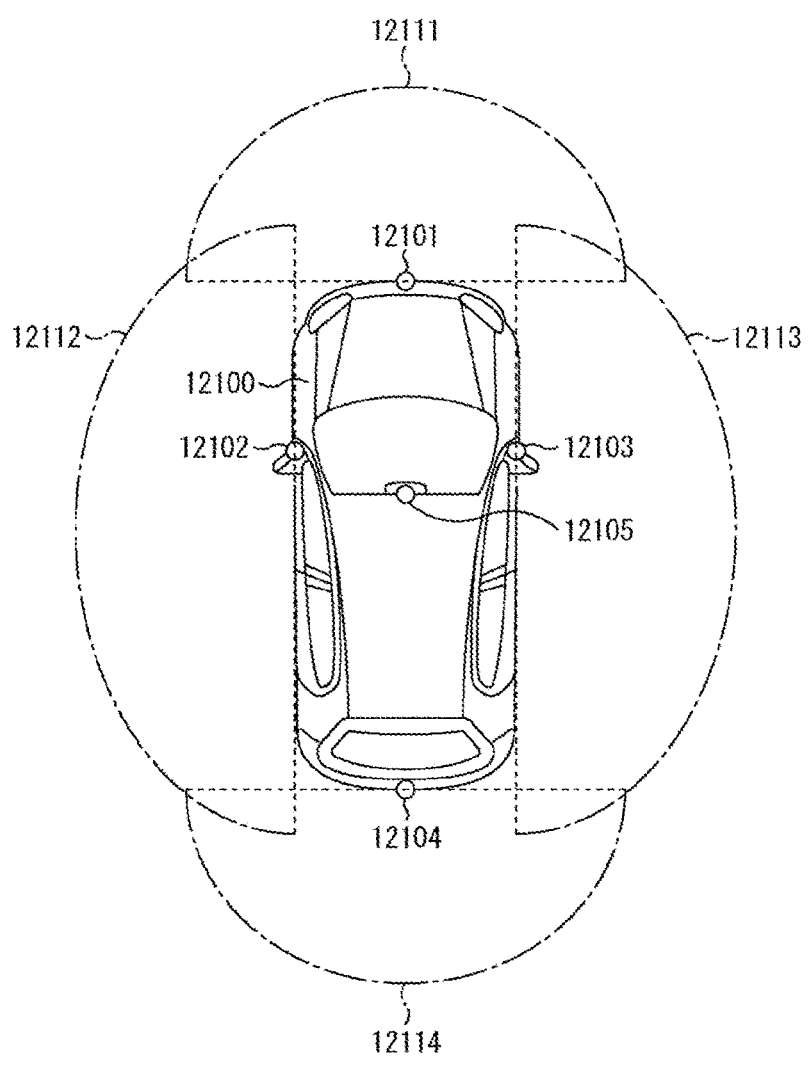
FIG. 32 is diagram illustrating an example of installation positions of a vehicle exterior information detection unit and an imaging unit.

FIG. 32 is a diagram illustrating an example of positions at which the imaging unit 12031 is installed.

In FIG. 32, a vehicle 12100 includes imaging units 12101, 12102, 12103, 12104, and 12105 as the imaging unit 12031.

The imaging units 12101, 12102, 12103, 12104, and 12105 may be provided at positions such as a front nose, side-view mirrors, a rear bumper, a back door, and an upper part of a windshield in a vehicle interior of the vehicle 12100, for example. The imaging unit 12101 provided at the front nose and the imaging unit 12105 provided at an upper part of the windshield in the vehicle interior mainly obtains front view images of the vehicle 12100. The imaging units 12102 and 12103 provided in the side-view mirrors mainly obtain side view images of the vehicle 12100. The imaging unit 12104 provided in the rear bumper or the back door mainly obtains a rear view image of the vehicle 12100. The front view images acquired by the imaging units 12101 and 12105 are mainly used for detection of preceding vehicles, pedestrians, obstacles, traffic signals, traffic signs, lanes, and the like.

FIG. 32 shows an example of imaging ranges of the imaging units 12101 to 12104. An imaging range 12111 indicates an imaging range of the imaging unit 12101 provided at the front nose, imaging ranges 12112 and 12113 respectively indicate the imaging ranges of the imaging units 12102 and 12103 provided at the side-view mirrors, and an imaging range 12114 indicates the imaging range of the imaging unit 12104 provided at the rear bumper or the back door. For example, a bird's-eye view image of the vehicle 12100 as viewed from above can be obtained by superimposition of image data captured by the imaging units 12101 to 12104.

At least one of the imaging units 12101 to 12104 may have a function for obtaining distance information. For example, at least one of the imaging units 12101 to 12104 may be a stereo camera constituted by a plurality of imaging elements or may be an imaging element having pixels for phase difference detection.

For example, the microcomputer 12051 can extract, particularly, a closest three-dimensional object on a path through which the vehicle 12100 is traveling, which is a three-dimensional object traveling at a predetermined speed (for example, 0 km/h or higher) in the substantially same direction as the vehicle 12100, as a preceding vehicle by acquiring a distance to each of three-dimensional objects in the imaging ranges 12111 to 12114 and temporal change in the distance (a relative speed with respect to the vehicle 12100) on the basis of distance information obtained from the imaging units 12101 to 12104. Furthermore, the microcomputer 12051 can set an inter-vehicle distance to be secured in front of the preceding vehicle in advance, and perform automatic brake control (including following stop control), automatic acceleration control (including following start control), and the like. Thus, it is possible to perform cooperative control for the purpose of, for example, autonomous driving in which the vehicle autonomously travels without requiring the driver to perform operations.

For example, the microcomputer 12051 can classify and extract three-dimensional object data regarding three-dimensional objects into two-wheeled vehicles, ordinary vehicles, large vehicles, pedestrians, and other three-dimensional objects such as utility poles on the basis of distance information obtained from the imaging units 12101 to 12104 and use the three-dimensional object data for automatic avoidance of obstacles. For example, the microcomputer 12051 classifies obstacles in the vicinity of the vehicle 12100 into obstacles that can be visually recognized by the driver of the vehicle 12100 and obstacles that are difficult to visually recognize. Then, the microcomputer 12051 can determine a risk of collision indicating the degree of risk of collision with each obstacle, and can perform driving assistance for collision avoidance by outputting a warning to a driver through the audio speaker 12061 or the display unit 12062 and performing forced deceleration or avoidance steering through the drive system control unit 12010 when the risk of collision has a value equal to or greater than a set value and there is a possibility of collision.

At least one of the imaging units 12101 to 12104 may be an infrared camera that detects infrared light. For example, the microcomputer 12051 can recognize a pedestrian by determining whether or not a pedestrian is present in images captured by the imaging units 12101 to 12104. Such recognition of a pedestrian is performed by, for example, a procedure of extracting a feature point in captured images of the imaging units 12101 to 12104 serving as infrared cameras, and a procedure of performing pattern matching processing on a series of feature points indicating the contour of an object to determine whether or not the object is a pedestrian. When the microcomputer 12051 determines that a pedestrian is present in the captured images of the imaging units 12101 to 12104 and recognizes the pedestrian, the audio/image output unit 12052 controls the display unit 12062 such that a square contour line for emphasis is superimposed on the recognized pedestrian and is displayed. In addition, the audio/image output unit 12052 may control the display unit 12062 so that an icon or the like indicating a pedestrian is displayed at a desired position.

The example of the vehicle control system to which the technology according to the present disclosure is applied has been described above. The technology according to the present disclosure can be applied to the vehicle exterior information detection unit 12030 and the imaging unit 12031 among the above-described components. Specifically, the light receiving element 1 or the distance measurement module 500 can be applied to a distance detection processing block of the vehicle exterior information detection unit 12030 and the imaging unit 12031. By applying the technology according to the present disclosure to the vehicle exterior information detection unit 12030 and the imaging unit 12031, it is possible to measure a distance to an object such as a person, a vehicle, an obstacle, a sign, or a character on a road surface with high accuracy, and it is possible to reduce a driver's fatigue of a driver and improve the safety level of a driver and a vehicle by using obtained distance information.

Embodiments of the present technology are not limited to the above-described embodiments, and various modifications can be made without departing from the gist of the present technology.

Further, in the above-described light receiving element 1, an example in which electrons are used as signal carriers has been described, but holes generated by photoelectric conversion may be used as signal carriers.

For example, in the pixel 10 of the above-described light receiving element 1, a configuration in which all or some of the configuration examples are arbitrarily combined can be adopted.

The effects described in the present specification are merely examples and are not limited, and there may be effects other than those described in the present specification.

The present technology can employ the following configurations.

(1)

A light receiving element including:

an on-chip lens;

a wiring layer; and a semiconductor layer which is disposed between the on-chip lens and the wiring layer and includes a photodiode, wherein the wiring layer includes a reflection film which is disposed such that at least a portion thereof overlaps the photodiode when seen in a plan view, and a transfer transistor which reads charge generated by the photodiode, and the reflection film is formed of a material different from that of a metal wiring electrically connected to a gate of the transfer transistor.

(2)

The light receiving element according to (1), wherein the reflection film is formed of a material having a reflectance in infrared rays which is lower than that of the metal wiring.

(3)

The light receiving element according to (1) or (2), wherein the reflection film is formed in the same layer as that of the metal wiring.

(4)

The light receiving element according to (1) or (2), wherein the reflection film is formed in a layer different from that of the metal wiring.

(5)

The light receiving element according to (4), wherein the reflection film is formed on a side closer to the semiconductor layer than the metal wiring.

(6)

The light receiving element according to (4) or (5), wherein the metal wiring is formed of copper.

(7)

The light receiving element according to (4) or (5), wherein the reflection film is formed of the same material as that of the gate of the transfer transistor.

(8)

The light receiving element according to (4) or (5), wherein the reflection film is constituted by a salicide film.

(9)

The light receiving element according to any one of (1) to (8), wherein a moth eye structure is formed at an interface between the semiconductor layer and the wiring layer.

(10)

The light receiving element according to any one of (1) to (9), wherein a surface shape of the reflection film on the semiconductor layer side has a moth eye structure.

(11)

The light receiving element according to any one of (1) to (10), wherein a moth eye structure is formed on a rear surface side of the semiconductor layer where the on-chip lens is formed.

(12)

The light receiving element according to any one of (1) to (8), wherein a first moth eye structure is formed on a rear surface side of the semiconductor layer where the on-chip lens is formed, and a second moth eye structure is formed at an interface between the semiconductor layer and the wiring layer.

(13)

The light receiving element according to (12), wherein the first moth eye structure and the second moth eye structure have the same cycle or shape.

(14)

The light receiving element according to (12), wherein the first moth eye structure and the second moth eye structure have different cycles or shapes.

(15)

The light receiving element according to any one of (1) to (8), wherein a dummy contact is provided on a surface of the reflection film on the semiconductor layer side.

(16)

The light receiving element according to (15), wherein the dummy contact has a shape different from that of a gate contact connected to the gate of the transfer transistor.

(17)

The light receiving element according to any one of (1) to (16), wherein two transfer transistors including a first transfer transistor and a second transfer transistor are formed in the semiconductor layer, the first transfer transistor transfers charge generated by the photodiode to a first charge accumulation portion, and the second transfer transistor transfers charge generated by the photodiode to a second charge accumulation portion.

(18)

The light receiving element according to any one of (1) to (17), further including: an inter-pixel light shielding unit shielding infrared rays in a pixel boundary portion of the wiring layer.

(19)

A distance measurement module including:

a predetermined light emitting source; and a light receiving element, wherein the light receiving element includes an on-chip lens, a wiring layer, and a semiconductor layer which is disposed between the on-chip lens and the wiring layer and includes a photodiode, the wiring layer includes a reflection film which is disposed such that at least a portion thereof overlaps the photodiode when seen in a plan view, and a transfer transistor which reads charge generated by the photodiode, and the reflection film is formed of a material different from that of a metal wiring electrically connected to a gate of the transfer transistor.

(20)

Electronic equipment including:

a distance measurement module including a predetermined light emitting source, and a light receiving element, wherein the light receiving element includes an on-chip lens, a wiring layer, and a semiconductor layer which is disposed between the on-chip lens and the wiring layer and includes a photodiode, the wiring layer includes a reflection film which is disposed such that at least a portion thereof overlaps the photodiode when seen in a plan view, and a transfer transistor which reads charge generated by the photodiode, and the reflection film is formed of a material different from that of a metal wiring electrically connected to a gate of the transfer transistor.

REFERENCE SIGNS LIST

1 Light receiving element
10 Pixel

21 Pixel array portion
M1 First metal film
M2 Second metal film
M3 Third metal film
PD Photodiode
41 Semiconductor substrate
42 Multi-layered wiring layer
44 Boundary portion (pixel boundary portion)
45 Inter-pixel light shielding film
47 On-chip lens
61 Inter-pixel separation portion
62 Insulating interlayer film
63 Reflection film
65 Inter-pixel light shielding unit
66 Gate contact
67 Metal wiring
71 Inter-pixel separation portion
111 Moth eye structure portion
141 (141P, 141M) Reflection film
161 Moth eye structure portion
181 Dummy contact
500 Distance measurement module
511 Light emission unit
513 Light receiving unit
601 Smartphone

What is claimed is:

1. A light receiving element, comprising:

an on-chip lens;

a wiring layer; and a semiconductor layer which is disposed between the on-chip lens and the wiring layer, wherein the semiconductor layer includes:

a photodiode; and a first floating diffusion region to store charge generated by the photodiode;

wherein the wiring layer includes:

a reflection film which is disposed such that at least a portion thereof overlaps the photodiode when seen in a plan view;

a first transfer transistor that transfers charge generated by the photodiode to the first floating diffusion region; and a wiring capacitance to store charge generated by the photodiode, wherein the reflection film is formed of a material different from that of a metal wiring electrically connected to a gate of the first transfer transistor, and wherein the reflection film is formed of a material having a reflectance for infrared rays lower than that of the metal wiring; and a first switching transistor that couples the first floating diffusion region to the wiring capacitance, wherein, in a cross-sectional view, the reflection film is between the wiring capacitance and the semiconductor layer.

2. The light receiving element according to claim 1, wherein the reflection film is formed in the same layer as that of the metal wiring.

3. The light receiving element according to claim 1, wherein the reflection film is formed in a layer different from that of the metal wiring.

4. The light receiving element according to claim 3, wherein the reflection film is formed on a side closer to the semiconductor layer than the metal wiring.

5. The light receiving element according to claim 3, wherein the metal wiring is formed of copper.

6. The light receiving element according to claim 3, wherein the reflection film is constituted by a salicide film.

7. The light receiving element according to claim 1, wherein a moth eye structure is formed at an interface between the semiconductor layer and the wiring layer.

8. The light receiving element according to claim 1, wherein a surface shape of the reflection film on a side of the semiconductor layer has a moth eye structure.

9. The light receiving element according to claim 1, wherein a moth eye structure is formed on a rear surface side of the semiconductor layer where the on-chip lens is formed.

10. The light receiving element according to claim 1, wherein a first moth eye structure is formed on a rear surface side of the semiconductor layer where the on-chip lens is formed, and a second moth eye structure is formed at an interface between the semiconductor layer and the wiring layer.

11. The light receiving element according to claim 10, wherein the first moth eye structure and the second moth eye structure have the same cycle or shape.

12. The light receiving element according to claim 10, wherein the first moth eye structure and the second moth eye structure have different cycles or shapes.

13. The light receiving element according to claim 1, wherein a dummy contact is provided on a surface of the reflection film on a side of the semiconductor layer.

14. The light receiving element according to claim 13, wherein the dummy contact has a shape different from that of a gate contact connected to the gate of the first transfer transistor.

15. The light receiving element according to claim 1, further comprising:

a second transfer transistor, wherein the second transfer transistor transfers charge generated by the photodiode to a second floating diffusion region.

16. The light receiving element according to claim 1, further comprising:

an inter-pixel light shielding unit shielding infrared rays in a pixel boundary portion of the wiring layer.

17. The light receiving element according to claim 3, wherein the reflection film is formed of the same material as that of the gate of the first transfer transistor.

18. A distance measurement module, comprising:

a predetermined light emitting source; and a light receiving element including:

an on-chip lens;

a wiring layer; and a semiconductor layer which is disposed between the on-chip lens and the wiring layer, wherein the semiconductor layer includes:

a photodiode; and a first floating diffusion region to store charge generated by the photodiode, wherein the wiring layer includes:

a reflection film which is disposed such that at least a portion thereof overlaps the photodiode when seen in a plan view;

a first transfer transistor that transfers charge generated by the photodiode to the first floating diffusion region; and a wiring capacitance to store charge generated by the photodiode, wherein the reflection film is formed of a material different from that of a metal wiring electrically connected to a gate of the first transfer transistor, and wherein the reflection film is formed of a material having a reflectance for infrared rays lower than that of the metal wiring, and a first switching transistor that couples the first floating diffusion region to the wiring capacitance, wherein, in a cross-sectional view, the reflection film is between the wiring capacitance and the semiconductor layer.

19. Electronic equipment, comprising:

a distance measurement module including a predetermined light emitting source, and a light receiving element, wherein the light receiving element includes an on-chip lens, a wiring layer, and a semiconductor layer which is disposed between the on-chip lens and the wiring layer, wherein the semiconductor layer includes:

a photodiode; and a first floating diffusion region to store charge generated by the photodiode;

wherein the wiring layer includes:

a reflection film which is disposed such that at least a portion thereof overlaps the photodiode when seen in a plan view;

a first transfer transistor that transfers charge generated by the photodiode to the first floating diffusion region; and a wiring capacitance to store charge generated by the photodiode, wherein the reflection film is formed of a material different from that of a metal wiring electrically connected to a gate of the first transfer transistor, and wherein the reflection film is formed of a material having a reflectance for infrared rays lower than that of the metal wiring; and a first switching transistor that couples the first floating diffusion region to the wiring capacitance, wherein, in a cross-sectional view, the reflection film is between the wiring capacitance and the semiconductor layer.

* * * * *